(12) United States Patent
Ohga et al.

(10) Patent No.: US 11,071,232 B2
(45) Date of Patent: Jul. 20, 2021

(54) LIQUID IMMERSION COOLING APPARATUS

(71) Applicant: FUJITSU LIMITED, Kawasaki (JP)

(72) Inventors: Kento Ohga, Yokohama (JP); Keita Hirai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/732,500

(22) Filed: Jan. 2, 2020

(65) Prior Publication Data

US 2020/0253086 A1 Aug. 6, 2020

(30) Foreign Application Priority Data

Feb. 5, 2019 (JP) .............................. JP2019-018777

(51) Int. Cl.
*H05K 7/20* (2006.01)
(52) U.S. Cl.
CPC ..... *H05K 7/20236* (2013.01); *H05K 7/20272* (2013.01); *H05K 7/203* (2013.01)
(58) Field of Classification Search
CPC . H05K 7/20236; H05K 7/203; H05K 7/20327
USPC ...................... 361/99; 165/80.4–80.5, 104.33
See application file for complete search history.

(56) References Cited

U.S. PATENT DOCUMENTS

| | | | | | |
|---|---|---|---|---|---|
| 4,302,793 | A | * | 11/1981 | Rohner | H05K 7/20272 174/15.1 |
| 4,317,336 | A | * | 3/1982 | Bennett | H01J 23/033 165/104.27 |
| 10,080,308 | B2 | * | 9/2018 | Hirai | H05K 7/20236 |
| 10,149,408 | B2 | * | 12/2018 | Fujiwara | H05K 5/068 |
| 2017/0280587 | A1 | * | 9/2017 | Watanabe | H05K 7/20272 |
| 2019/0014685 | A1 | * | 1/2019 | So | H05K 7/20809 |

FOREIGN PATENT DOCUMENTS

JP 2017-183344 A 10/2017

* cited by examiner

*Primary Examiner* — Zachary Pape
(74) *Attorney, Agent, or Firm* — Fujitsu Patent Center

(57) ABSTRACT

A liquid immersion cooling apparatus includes a first receptacle in which a refrigerant liquid is accommodated, configured to include a first tank having a first sidewall, a first lid configured to cover the first tank, and a first space provided between the refrigerant liquid and the first lid, a second receptacle in which a sealing material is accommodated, configured to include a second tank having a second sidewall facing the first sidewall, a second lid configured to cover the second tank, a second space provided between the sealing material and the second lid, and configured to communicate with the first space, and a third space provided between the sealing material and the second lid, partitioned from the second space, and configured to communicate with an outside, and a heat insulator provided between the first sidewall and the second sidewall.

13 Claims, 28 Drawing Sheets

LIQUID IMMERSION COOLING APPARATUS

CROSS-REFERENCE TO RELATED APPLICATION

This application is based upon and claims the benefit of the prior Japanese Patent Application No. 2019-018777, filed on Feb. 5, 2019, the entire contents of which are incorporated herein by reference.

FIELD

The embodiments discussed herein are related to a liquid immersion cooling apparatus.

BACKGROUND

As one of techniques of cooling an electronic device such as a server that generates heat during operation, a liquid immersion cooling apparatus has been known for cooling an electronic device by immersing the electronic device in a refrigerant liquid such as a fluorine-based inert liquid accommodated in a tank.

Related techniques are disclosed in, for example, Japanese Laid-Open Patent Publication No. 2017-183344.

SUMMARY

According to an aspect of the embodiments, a liquid immersion cooling apparatus includes a first receptacle in which a refrigerant liquid is accommodated, configured to include a first tank having a first sidewall, a first lid configured to cover the first tank, and a first space provided between the refrigerant liquid and the first lid, a second receptacle in which a sealing material is accommodated, configured to include a second tank having a second sidewall facing the first sidewall, a second lid configured to cover the second tank, a second space provided between the sealing material and the second lid, and configured to communicate with the first space, and a third space provided between the sealing material and the second lid, partitioned from the second space, and configured to communicate with an outside, and a heat insulator provided between the first sidewall and the second sidewall.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a liquid immersion cooling apparatus, a refrigerant liquid accommodated in a tank may be heated, evaporated, and reduced by an electronic device immersed therein. When the amount of the refrigerant liquid in the tank is reduced, there is a concern that the electronic device may be exposed from the refrigerant liquid resulting in insufficient cooling of the electronic device or, frequent replenishment of the reduced amount of the refrigerant liquid is required increasing the operation costs.

Hereinafter, embodiments of a technique capable of preventing a reduction of the refrigerant liquid in a liquid immersion cooling apparatus will be described in detail with reference to the accompanying drawings.

First Embodiment

Figure 1:
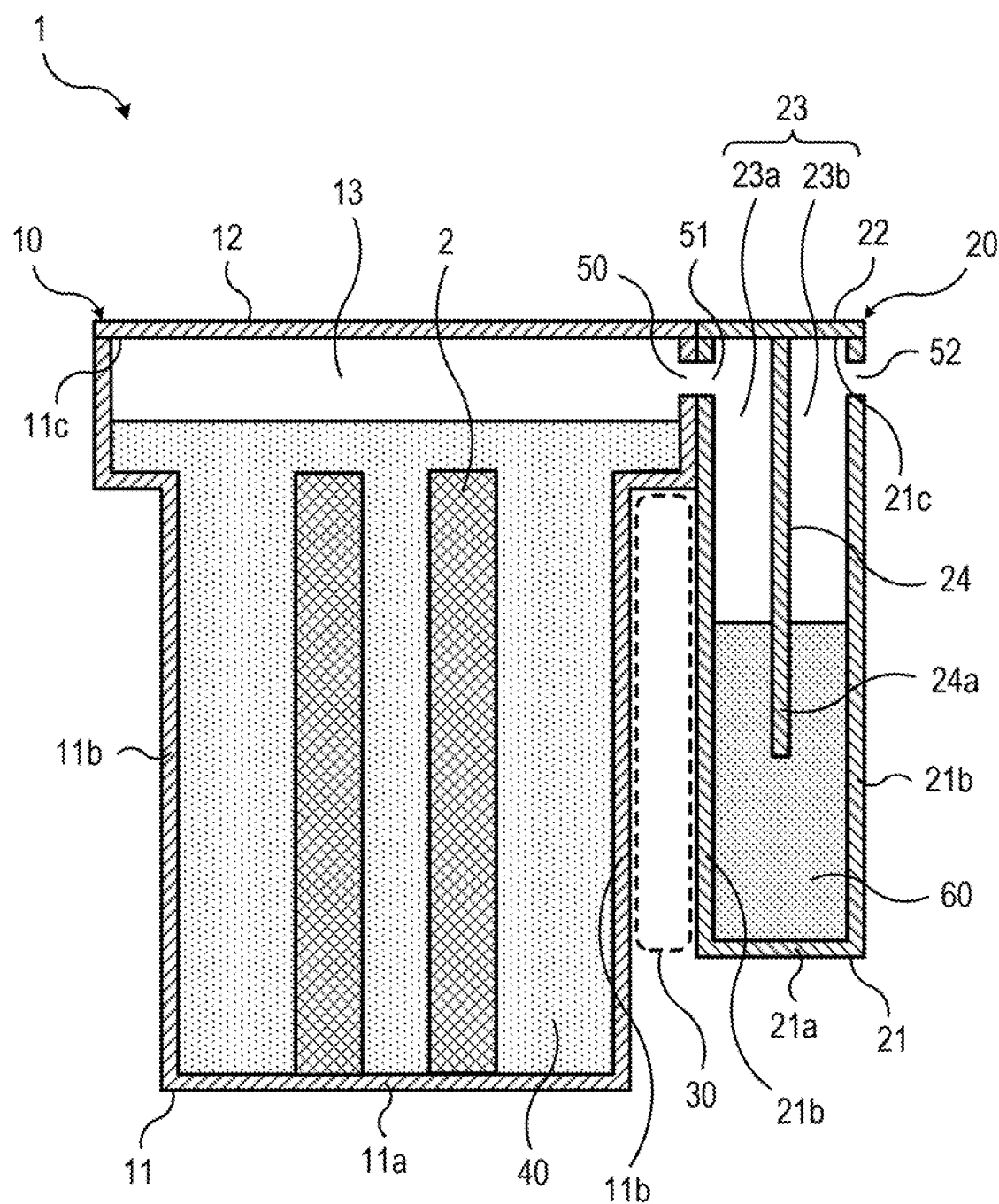
FIG. 1 is a diagram illustrating an example of a liquid immersion cooling apparatus according to a first embodiment.

FIG. 1 is a diagram illustrating an example of a liquid immersion cooling apparatus according to a first embodiment. FIG. 1 schematically illustrates a cross-sectional view of the major part of an example of the liquid immersion cooling apparatus.

The liquid immersion cooling apparatus 1 illustrated in FIG. 1 includes a liquid immersion tank 10, a sealing tank 20, and a heat insulating portion 30 provided therebetween. For example, the liquid immersion tank 10 is the first receptacle, the sealing tank 20 is the second receptacle, and the heat insulating portion 30 is the heat insulator.

The liquid immersion tank 10 includes a liquid immersion tank main body 11 and a lid body 12. The liquid immersion tank main body 11 has a bottom portion 11a, a sidewall 11b rising upward from the bottom portion 11a, and an opening 11c provided in the upper end of the sidewall 11b. The lid body 12 is provided to cover the opening 11c in the liquid immersion tank main body 11. The liquid immersion tank main body 11 and the lid body 12 are made of, for example, a metal material, a resin material, a carbon material, or a glass material, or a composite material of fibers or cloth of a carbon material and a resin material. Moreover, the liquid immersion tank main body 11 and the lid body 12 may be made of the same kind of material or different kinds of materials. For example, the liquid immersion tank main body 11 is the first tank and the lid body 12 is the first lid.

The liquid immersion tank main body 11 stores and accommodates a refrigerant liquid 40 therein. Examples of the refrigerant liquid 40 include a fluorine-based inert liquid that has high heat transfer efficiency, an insulation property, and little influence on the human body or the environment. An electronic device 2 that generates heat during operation is immersed in the refrigerant liquid 40 accommodated in the liquid immersion tank main body 11. The heat generated in the electronic device 2 is transferred to the refrigerant liquid 40, so that the electronic device 2 is cooled. The liquid immersion tank 10 is also referred to as a refrigerant tank. Moreover, the electronic device 2 immersed in the refrigerant liquid 40 of the liquid immersion tank 10 is not limited as to the kind or number thereof.

The liquid immersion tank 10 is provided with a gas phase portion (or space) 13 between the refrigerant liquid 40 (the liquid surface thereof) accommodated in the liquid immersion tank main body 11 and the lid body 12 (the inner surface thereof). The gas phase portion 13 of the liquid immersion tank 10 may contain the air or refrigerant vapor that evaporates from the refrigerant liquid 40 by temperature rise due to the heat transfer from the electronic device 2. In the liquid immersion tank 10, for example, a vent hole 50 is provided in a portion of the sidewall 11b of the liquid immersion tank main body 11 to communicate with the gas phase portion 13. For example, the gas phase portion 13 is the first space.

The sealing tank 20 is provided adjacent to the liquid immersion tank 10. The sealing tank 20 includes a sealing tank main body 21 and a lid body 22. The sealing tank main body 21 has a bottom portion 21a, a sidewall 21b rising upward from the bottom portion 21a, and an opening 21c provided in the upper end of the sidewall 21b. The lid body 22 is provided to cover the opening 21c in the sealing tank main body 21. The sealing tank main body 21 and the lid body 22 are made of, for example, a metal material, a resin material, a carbon material, or a glass material, or a composite material of fibers or cloth of a carbon material and a resin material. Moreover, the sealing tank main body 21 and the lid body 22 may be made of the same kind of material or different kinds of materials. Further, the sealing tank main body 21 and the lid body 22 may be made of the same kind of material as or different kinds of materials from the liquid immersion tank main body 11 and the lid body 12. For example, the sealing tank main body 21 is the second tank and the lid body 22 is the second lid.

The sealing tank 20 is provided adjacent to the liquid immersion tank 10 such that the sidewall 21b of the sealing tank main body 21 faces the sidewall 11b of the liquid immersion tank main body 11. For example, the sealing tank 20 and the liquid immersion tank 10 are provided adjacent to each other such that a portion of the sidewall 21b and a portion of the sidewall 11b which face each other are connected to each other and the remaining portions thereof are spaced apart from each other.

The sealing tank main body 21 stores and accommodates a sealing material 60 therein. For the sealing material 60, for example, the same kind (e.g., fluorine-based inert liquid) as the refrigerant liquid 40 accommodated in the liquid immersion tank 10 is used. For the sealing material 60, a different material from the refrigerant liquid 40 accommodated in the liquid immersion tank 10, for example, a material that is difficult to dissolve in the refrigerant liquid 40 and the refrigerant vapor (e.g., water or oil) or a material that is melted by heating and solidified by cooling (e.g., a brazing material, a solder, or a resin). The sealing material 60 in a liquid or liquid phase state is also referred to as a sealing liquid or a refrigerant liquid.

The sealing tank 20 is provided with a gas phase portion (or space) 23 between the sealing material 60 (the surface thereof) accommodated in the sealing tank main body 21 and the lid body 22 (the inner surface thereof). The lid body 22 is provided with a partition member 24, a lower end portion 24a of which is introduced into the sealing material 60 accommodated in the sealing tank main body 21. The gas phase portion 23 of the sealing tank 20 is divided into two gas phase portions 23a and 23b by the partition member 24 which is provided on the lid body 22 and has the lower end portion 24a introduced into the sealing material 60. For example, the gas phase portion 23a is the second space and the gas phase portion 23b is the third space.

In the sealing tank 20, a portion of the sidewall 21b of the sealing tank main body 21 is provided with a vent hole 51 which communicates with one gas phase portion 23a and a vent hole 52 which communicates with the other gas phase portion 23b. The vent hole 51 which communicates with one gas phase portion 23a of the sealing tank 20 is provided at a position corresponding to the vent hole 50 which communicates with the gas phase portion 13 of the liquid immersion tank 10. One gas phase portion 23a of the sealing tank 20 communicates with the gas phase portion 13 of the liquid immersion tank 10 through the vent hole 51 and the vent hole 50. The other gas phase portion 23b of the sealing tank 20 communicates with the outside of the liquid immersion cooling apparatus 1 (hereinafter referred to as "the outside of the apparatus") through the vent hole 52. The gas phase portion 23a of the sealing tank 20 which communicates with the gas phase portion 13 of the liquid immersion tank 10 may contain the air or the refrigerant vapor diffusing from the gas phase portion 13 of the liquid immersion tank 10. The gas phase portion 23b of the sealing tank 20 which communicates with the outside of the apparatus may contain the air.

The heat insulating portion 30 is provided in a portion between the sidewall 11b and the sidewall 21b which are spaced apart from each other so as to face each other (the portion other than a connection portion between a portion of the sidewall 11b and a portion of the sidewall 21b) of the liquid immersion tank 10 and the sealing tank 20 provided adjacent to each other. The heat insulating portion 30 is made of a material having a lower thermal conductivity than the material used for the liquid immersion tank main body 11 and the sealing tank main body 21. In the liquid immersion cooling apparatus 1, heat transfer from the liquid immersion tank 10 to the sealing tank 20 is prevented by the heat insulating portion 30.

Figure 2:
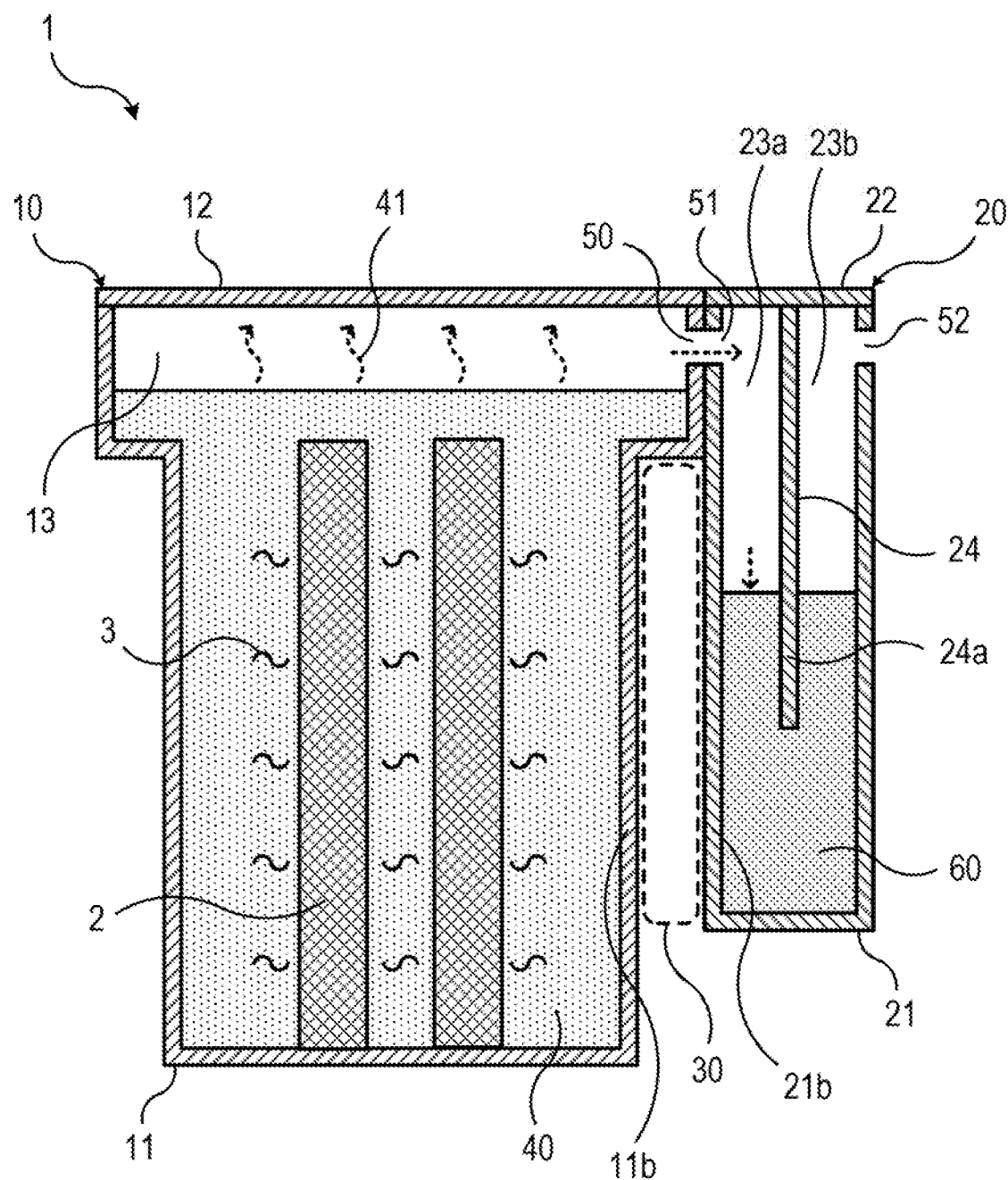
FIG. 2 is a diagram illustrating an example of a use situation of the liquid immersion cooling apparatus according to the first embodiment.

Here, FIG. 2 is a diagram illustrating an example of a use situation of the liquid immersion cooling apparatus according to the first embodiment. FIG. 2 schematically illustrates a cross-sectional view of the major part at the time of use of an example of the liquid immersion cooling apparatus.

In the liquid immersion cooling apparatus 1, the refrigerant liquid 40 is accommodated in the liquid immersion tank main body 11, and the electronic device 2 (in this example, two electronic devices in the cross-sectional view) that generates heat during operation is immersed in the refrigerant liquid 40. The heat 3 generated in the electronic device 2 is transferred to the refrigerant liquid 40, so that the electronic device 2 is cooled.

The temperature of the refrigerant liquid 40 rises by the heat 3 transferred from the electronic device 2. When the refrigerant liquid 40 evaporates by temperature rise, refrigerant vapor 41 (indicated by dotted line arrows in FIG. 2 and FIG. 3 to be described later) is generated from the refrigerant liquid 40. The refrigerant vapor 41 is collected in the gas phase portion 13 of the liquid immersion tank 10, and some of the refrigerant vapor 41 diffuses to one gas phase portion 23a of the sealing tank 20 which communicates with the gas phase portion 13 through the vent hole 50 and the vent hole 51. The volume of the gas phase portion 13 of the liquid immersion tank 10 (or the volume of the refrigerant liquid 40 to be accommodated and the volume of the electronic device 2 to be immersed) and the volume of the gas phase portion 23a of the sealing tank 20 (or the volume of the sealing material 60 to be accommodated) is set, for example, based on the amount of the refrigerant vapor 41 to be generated.

In the sealing tank 20, one gas phase portion 23a is partitioned from the other gas phase portion 23b which communicates with the outside of the apparatus through the vent hole 52 by the sealing material 60 accommodated in the sealing tank main body 21 and the partition member 24 provided on the lid body 22. By the sealing material 60 and the partition member 24, the refrigerant vapor 41 generated in the liquid immersion tank 10 is sealed and the refrigerant vapor 41 diffused from the gas phase portion 13 to one gas phase portion 23a of the sealing tank 20 is prevented from diffusing to the other gas phase portion 23b and from being exited from the other gas phase portion 23b to the outside of the apparatus. That is, the sealing tank 20 functions as a trap or a seal, and prevents the refrigerant vapor 41 generated in the liquid immersion tank 10 from being exited to the outside of the apparatus.

Figure 5:
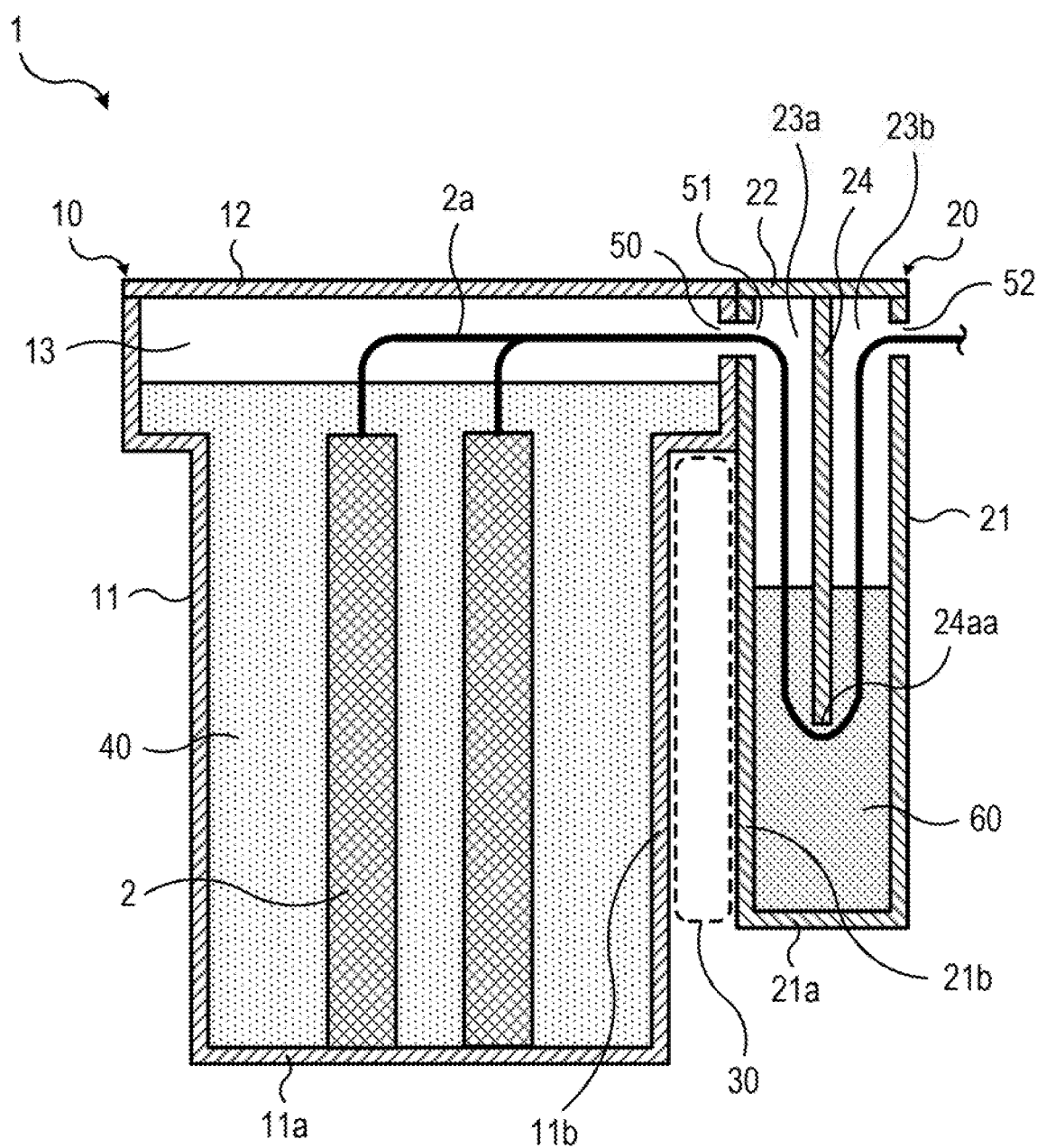
FIG. 5 is a diagram (Part 1) illustrating a second configuration example of the liquid immersion cooling apparatus according to the first embodiment.

For example, the vent hole 50 is provided in the liquid immersion tank 10, and serves as a hole for drawing out a cable connected to the electronic device 2 immersed in the refrigerant liquid 40 of the liquid immersion tank 10 to the outside of the apparatus as described later (FIG. 5). When the sealing tank 20 as described above is not provided and the cable drawing hole provided in the liquid immersion tank 10, i.e., the vent hole 50 is directly connected to the outside of the apparatus, the refrigerant vapor 41 generated in the liquid immersion tank 10 is directly exited to the outside of the apparatus, so that a reduction of the refrigerant liquid 40 in the liquid immersion tank 10 is accelerated. In the liquid immersion cooling apparatus 1, the sealing tank 20 as described above is provided and the vent hole 50 in the liquid immersion tank 10 is not directly connected to the outside of the apparatus, but the sealing material 60 is interposed between the vent hole 50 and the outside of the apparatus, i.e., between the gas phase portion 23a and the gas phase portion 23b which communicate respectively with the vent hole 50 and the outside of the apparatus. Thus, the refrigerant vapor 41 generated in the liquid immersion tank 10 is prevented from being exited to the outside of the apparatus. In the liquid immersion cooling apparatus 1, by providing the sealing tank 20, it is possible to form a path extending from the inside of the liquid immersion tank 10 to the outside of the apparatus without directly communicating the liquid immersion tank 10 with the outside of the apparatus. The sealing tank 20 used for drawing out the cable is also referred to as a cable box.

In the liquid immersion cooling apparatus 1, further, the sealing tank 20 is provided adjacent to the liquid immersion tank 10 with the heat insulating portion 30 interposed therebetween. By providing the heat insulating portion 30 between the sealing tank 20 and the liquid immersion tank 10 as described above, the heat of the refrigerant liquid 40, the temperature of which has risen during heat generation of the electronic device 2, is effectively prevented from being transferred from the liquid immersion tank main body 11 to the sealing tank main body 21 and from being further transferred from the sealing tank main body 21 to the sealing material 60. Thus, temperature rise of the sealing material 60 and the resulting evaporation of the sealing material 60 are prevented.

Figure 3:
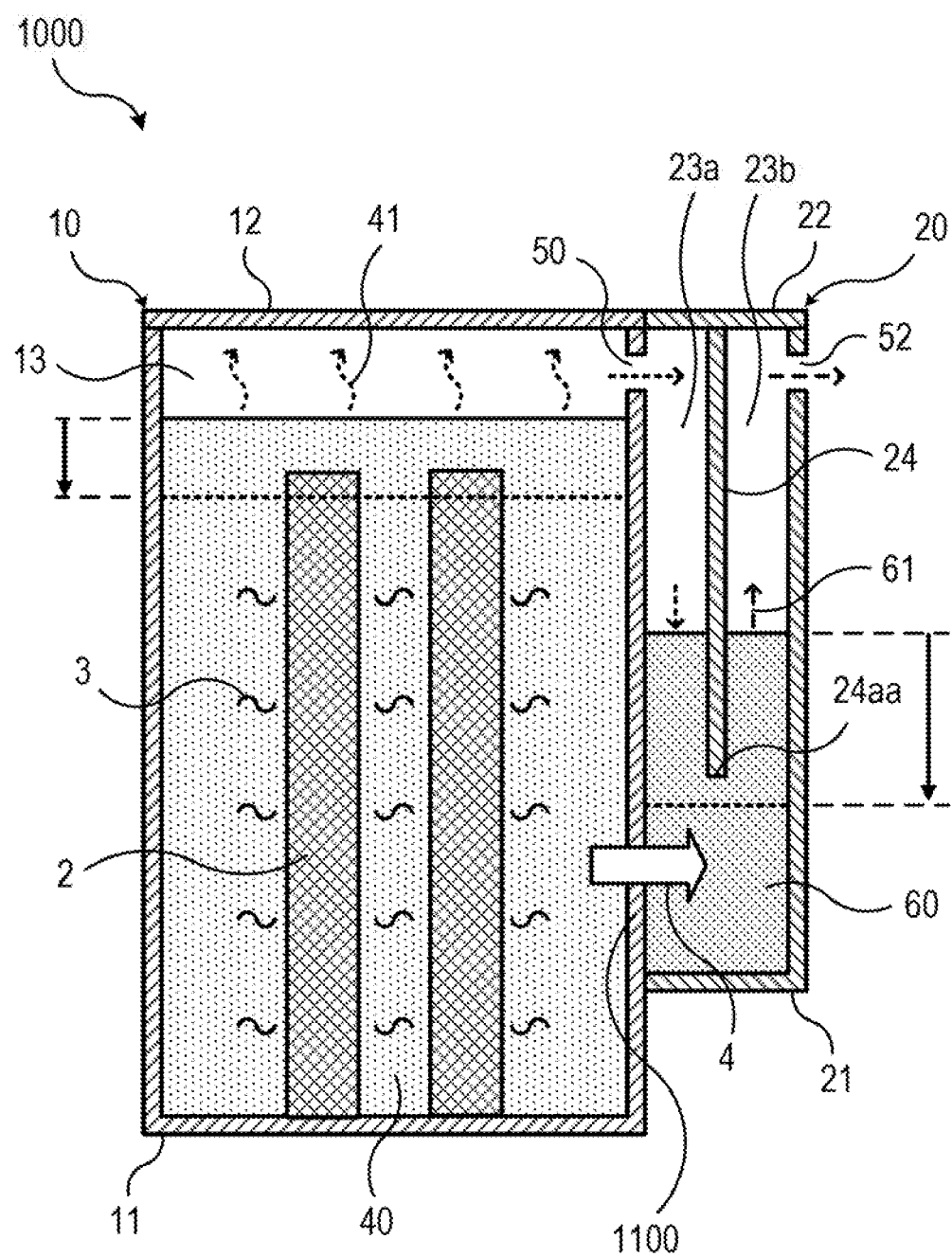
FIG. 3 is a diagram illustrating an example of a use situation of a liquid immersion cooling apparatus according to another embodiment.

For comparison, a liquid immersion cooling apparatus having no heat insulating portion 30 will be described with reference to FIG. 3. FIG. 3 is a diagram illustrating an example of a use situation of a liquid immersion cooling apparatus according to another embodiment. FIG. 3 schematically illustrates a cross-sectional view of the major part at the time of use of an example of the liquid immersion cooling apparatus.

The liquid immersion cooling apparatus 1000 illustrated in FIG. 3 has a configuration in which the heat insulating portion 30 as described above is not provided and the sealing tank 20 is provided adjacent to the liquid immersion tank 10 so as to share a portion of a sidewall 1100 thereof with the liquid immersion tank 10. In the liquid immersion cooling apparatus 1000, the heat 4 of the refrigerant liquid 40, the temperature of which has risen by the heat 3 generated in the electronic device 2, is relatively easily transferred to the sealing material 60 of the sealing tank 20 through the sidewall 1100.

For example, in a case where the same material as the refrigerant liquid 40 is used for the sealing material 60, when the heat 4 of the refrigerant liquid 40 is transferred to the sealing material 60 so that the temperature of the sealing material 60 rises, the sealing material 60 (sealing liquid or refrigerant liquid) may evaporate in the same manner as the refrigerant liquid 40 of the liquid immersion tank 10. When the sealing material 60 evaporates and thus the sealing material vapor 61 (indicated by a chain line arrow in FIG. 3) is generated, the sealing material vapor 61 may be exited from the gas phase portion 23b to the outside of the apparatus through the vent hole 52. When the sealing material vapor 61 is exited to the outside of the apparatus, the accommodated sealing material 60 is reduced. Moreover, in FIG. 3, an example of transition of the surface position of the sealing material 60 is indicated by a solid line arrow.

When the sealing material 60 of the sealing tank 20 is reduced and thus the volume of the gas phase portion 23a is increased, an increased amount of the refrigerant vapor 41 in the gas phase portion 13 of the liquid immersion tank 10 may diffuse to the gas phase portion 23a of the sealing tank 20 through the vent hole 50 and generation of the refrigerant vapor 41 in the liquid immersion tank 10 may proceed. As a result, the refrigerant liquid 40 accommodated in the liquid immersion tank 10 may be reduced. Moreover, in FIG. 3, an example of transition of the surface position of the refrigerant liquid 40 is indicated by a solid line arrow.

When the reduction of the sealing material 60 due to evaporation proceeds and the surface position of the sealing material 60 is lowered below a lower end 24aa of the partition member 24, the gas phase portion 23a and the gas phase portion 23b communicate with each other in the sealing tank 20. When the gas phase portion 23a and the gas phase portion 23b communicate with each other, a path through which the refrigerant vapor 41 is exited to the outside of the apparatus without being trapped in the sealing tank 20 is formed. When such a path is formed, the refrigerant liquid 40 of the liquid immersion tank 10 is more likely to be reduced by exhaust of the refrigerant vapor 41 to the outside of the apparatus.

Further, the same phenomenon as described above may occur even when a different material from the refrigerant liquid 40 is used for the sealing material 60. For example, when the heat 4 of the refrigerant liquid 40 is transferred to the sealing material 60 so that the temperature of the sealing material 60 rises, the sealing material vapor 61 is generated by evaporation or melting and evaporation of the sealing material 60 or by sublimation thereof. Even in such a case, the reduction of the sealing material 60 in the sealing tank 20 due to evaporation and the reduction of the refrigerant liquid 40 in the liquid immersion tank 10 due to the reduction of the sealing material 60 as described above may occur.

Further, according to the kind of the sealing material 60, when the heat 4 of the refrigerant liquid 40 is transferred to the sealing material 60 so that the temperature of the sealing material 60 rises, the refrigerant vapor 41 may be easily dissolved or absorbed by the sealing material 60. Even in such a case, generation of the refrigerant vapor 41 in the liquid immersion tank 10 and diffusion of the refrigerant vapor 41 to the sealing tank 20 may proceed, and a reduction of the refrigerant liquid 40 in the liquid immersion tank 10 may occur.

In the liquid immersion cooling apparatus 1000, when the refrigerant liquid 40 of the liquid immersion tank 10 is reduced, the immersed electronic device 2 may be exposed from the refrigerant liquid 40, which may cause the electronic device 2 to be insufficiently cooled and may result in performance deterioration or destruction of the electronic device 2 due to overheating. Therefore, the liquid immersion tank 10 is replenished with the refrigerant liquid 40 for the reduced amount. However, as described above, for the refrigerant liquid 40 in which the electronic device 2 is immersed, a liquid that has high heat transfer efficiency, an insulation property, and little influence on the human body or the environment is used, and this type of refrigerant liquid 40 is relatively expensive. Therefore, when the refrigerant liquid 40 is rapidly reduced due to evaporation and the replenishment amount or replenishment frequency of the refrigerant liquid 40 increases, the costs associated with the replenishment of the refrigerant liquid 40 (e.g., replenishment operation costs or use costs of the refrigerant liquid 40) increase.

In this way, even in the liquid immersion cooling apparatus 1000 provided with the sealing tank 20 for trapping the refrigerant vapor 41 from the liquid immersion tank 10, evaporation of the refrigerant liquid 40 of the liquid immersion tank 10 during the cooling of the electronic device 2 that generates heat and the resulting reduction of the refrigerant liquid 40 may occur. As described above, the reduction of the refrigerant liquid 40 in the liquid immersion tank 10 occurs due to the temperature rise and evaporation of the sealing material 60 of the sealing tank 20 and the resulting reduction of the sealing material 60. In order to prevent the reduction of the refrigerant liquid 40 in the liquid immersion tank 10, the sealing tank 20 is replenished with the sealing material 60 for the reduced amount. For example, when the same kind of refrigerant liquid 40 is used for the sealing material 60, the sealing tank 20 is replenished with the same kind of the sealing material 60 as the refrigerant liquid for the reduced amount. However, in this case, when the sealing material 60 is rapidly reduced and the replenishment amount or replenishment of the sealing material 60 increases, the costs associated with the replenishment increases as described above. This may also be equally applied to a case where a different material from the refrigerant liquid 40 is used for the sealing material 60, and the costs associated with the replenishment of the reduced amount may increase.

Meanwhile, in the liquid immersion cooling apparatus 1 (FIGS. 1 and 2), the heat insulating portion 30 is provided between the liquid immersion tank 10 and the sealing tank 20. By the heat insulating portion 30, the heat transferred from the electronic device 2 to the refrigerant liquid 40 is prevented from being transferred to the sealing material 60 through the liquid immersion tank main body 11 and the sealing tank main body 21, and temperature rise of the sealing material 60 and the resulting evaporation of the sealing material 60 are prevented. Since the evaporation of the sealing material 60 of the sealing tank 20 is prevented, the reduction the sealing material 60 due to the evaporation is prevented, and the resulting reduction of the refrigerant liquid 40 in the liquid immersion tank 10 is prevented. That is, the progress of the evaporation of the refrigerant liquid 40 due to an increase in the volume of the gas phase portion 23a which is generated by the reduction of the sealing material 60 due to evaporation, and the exhaust of the refrigerant liquid 40 to the outside of the apparatus due to communication between the gas phase portion 23a and the gas phase portion 23b are prevented, and the reduction of the refrigerant liquid 40 is prevented.

According to the liquid immersion cooling apparatus 1, it is possible to prevent the reduction of the sealing material 60 in the sealing tank 20 due to evaporation, to reduce the replenishment amount or replenishment frequency of the sealing material 60 and to reduce the costs associated with the replenishment. According to the liquid immersion cooling apparatus 1, it is possible to prevent the reduction of the refrigerant liquid 40 in the liquid immersion tank 10 caused by the reduction of the sealing material 60 in the sealing tank 20 due to evaporation, to reduce the replenishment amount or replenishment frequency of the refrigerant liquid 40, and to reduce the costs associated with the replenishment. According to the liquid immersion cooling apparatus 1, it is possible to prevent the reduction of the refrigerant liquid 40 in the liquid immersion tank 10 and sufficiently cool the electronic device 2 by preventing the electronic device 2 from being exposed from the refrigerant liquid 40.

Next, a configuration example of the liquid immersion cooling apparatus 1 will be described.

Figure 4A:
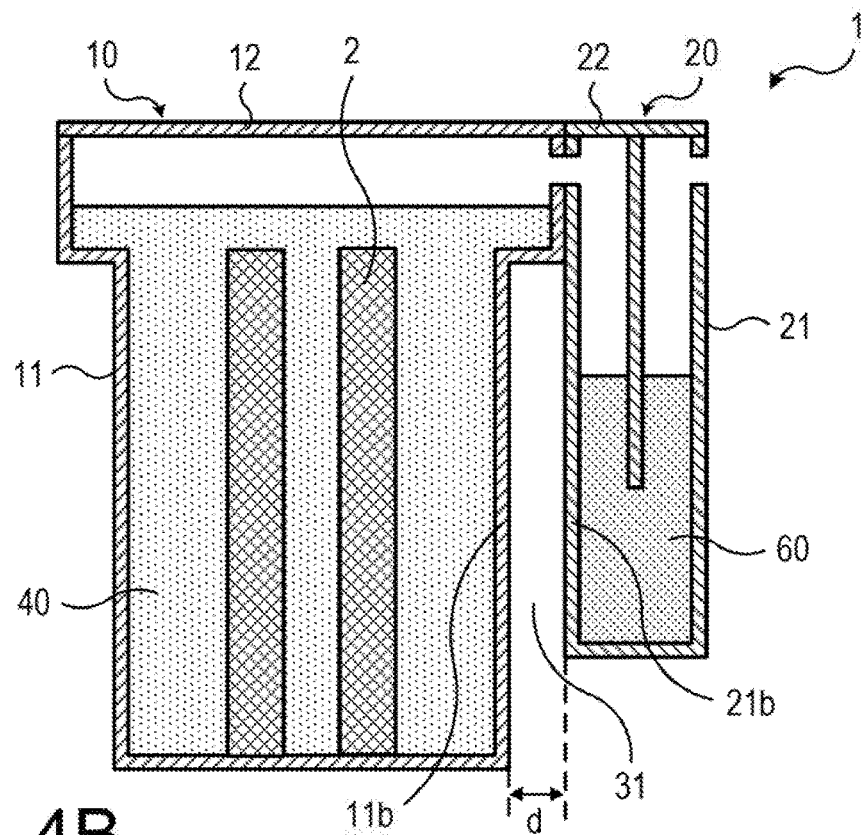
FIGS. 4A and 4B are diagrams illustrating a first configuration example of the liquid immersion cooling apparatus according to the first embodiment.
Figure 4B:
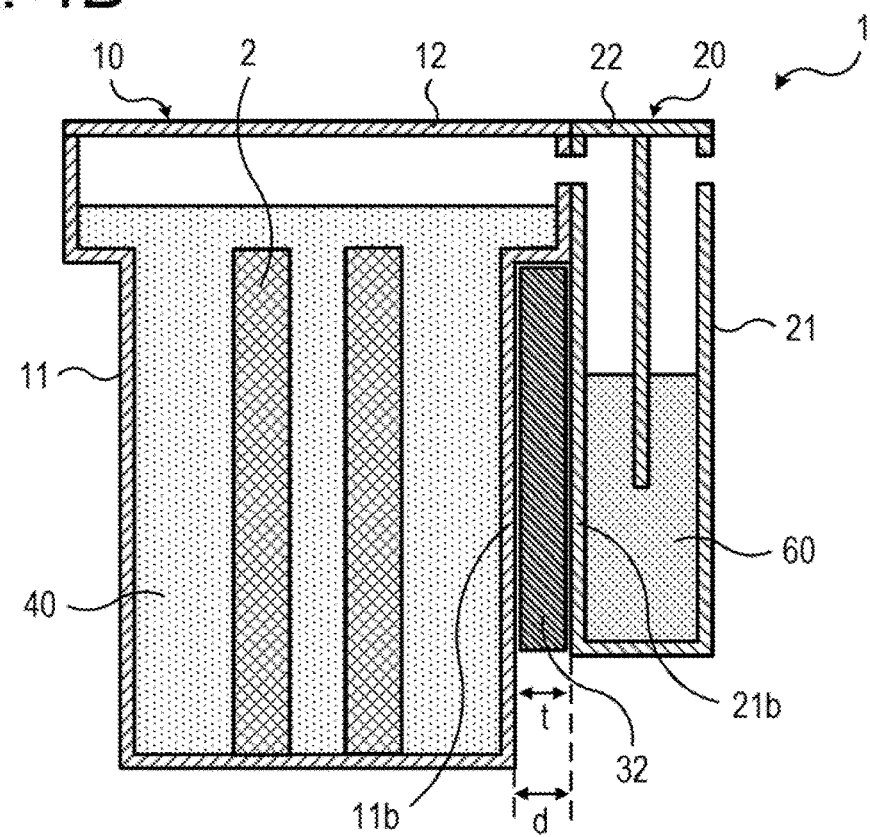

FIGS. 4A and 4B are diagrams illustrating a first configuration example of the liquid immersion cooling apparatus according to the first embodiment. FIGS. 4A and 4B schematically illustrate cross-sectional views of the major part of an example of the liquid immersion cooling apparatus, respectively.

As for the heat insulating portion 30 between the liquid immersion tank 10 and the sealing tank 20 of the liquid immersion cooling apparatus 1, for example, as illustrated in FIG. 4A, a hollow portion (e.g., space, cavity, or air layer) 31 provided between the sidewall 11b of the liquid immersion tank main body 11 and the sidewall 21b of the sealing tank main body 21 facing the sidewall 11b may be used. When the hollow portion 31 is used as the heat insulating portion 30, a distance d between the sidewall 11b of the liquid immersion tank main body 11 and the sidewall 21b of the sealing tank main body 21 which face each other is set to a value that prevents a heat transfer from the refrigerant liquid 40 to the sealing material 60, the resulting temperature rise, and evaporation of the sealing material 60. For example, the distance d may be set based on the amount of heat generated in the electronic device 2, the type of the refrigerant liquid 40 (e.g., thermal conductivity or vapor pressure), the material of the liquid immersion tank main body 11 and the sealing tank main body 21 (e.g., thermal conductivity), and the type of the sealing material 60 (e.g., thermal conductivity or vapor pressure).

Further, as for the heat insulating portion 30 between the liquid immersion tank 10 and the sealing tank 20 of the liquid immersion cooling apparatus 1, for example, as illustrated in FIG. 4B, a heat insulating material 32 provided between the sidewall 11b of the liquid immersion tank main body 11 and the sidewall 21b of the sealing tank main body 21 facing the sidewall 11b is used. For the heat insulating material 32, for example, a foam-based heat insulating material such as polystyrene foam (foamed polystyrene), urethane foam or phenol foam, or a fiber-based heat insulating material such as glass wool, rock wool or cellulose fibers may be used. When the heat insulating material 32 is used as the heat insulating portion 30, the distance d between the sidewall 11b of the liquid immersion tank main body 11 and the sidewall 21b of the sealing tank main body 21 and a thickness t of the heat insulating material 32 provided therebetween are set to predetermined values. That is, the distance d and the thickness t are set to values that prevent a heat transfer from the refrigerant liquid 40 to the sealing material 60 and the resulting temperature rise and evaporation of the sealing material 60. For example, the distance d and the thickness t may be set based on the amount of heat generated in the electronic device 2, the type of the refrigerant liquid 40 (e.g., thermal conductivity or vapor pressure), the material of the liquid immersion tank main body 11 and the sealing tank main body 21 (e.g., thermal conductivity), the type of the sealing material 60 (e.g., thermal conductivity or vapor pressure), and the type of the heat insulating material 32 (thermal conductivity).

Figure 6A:
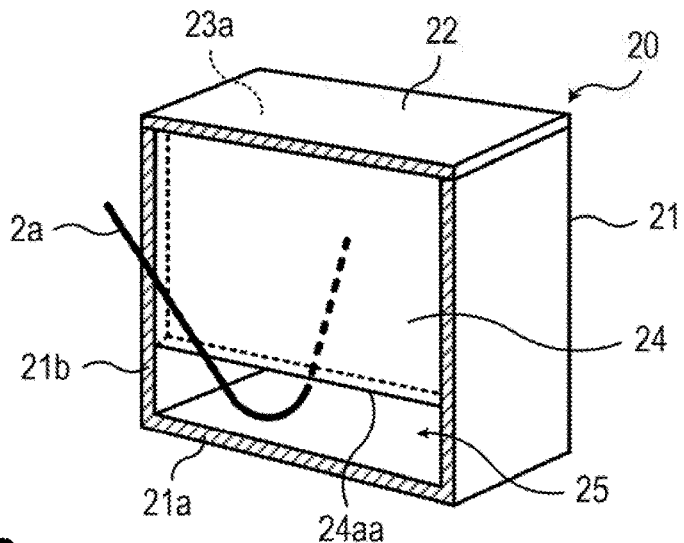
FIGS. 6A to 6C are diagrams (Part 2) illustrating the second configuration example of the liquid immersion cooling apparatus according to the first embodiment.
Figure 6B:
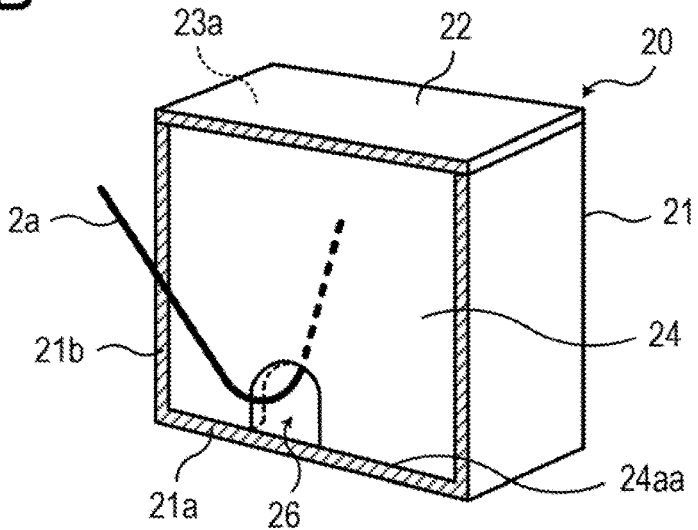
Figure 6C:
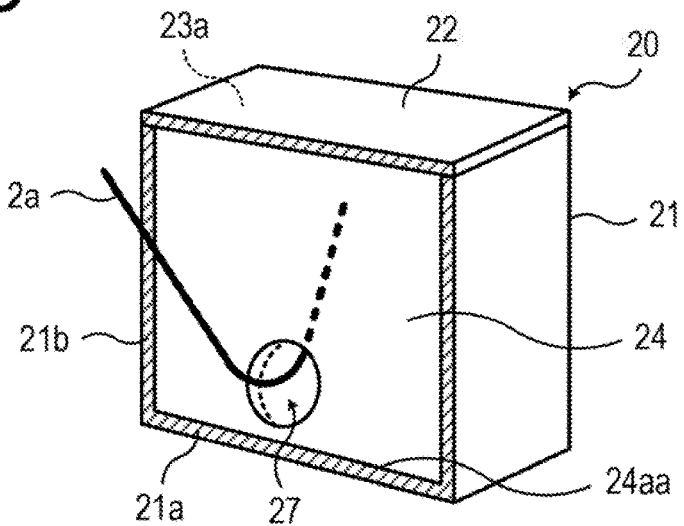

FIGS. 5 and 6A to 6C are diagrams illustrating a second configuration example of the liquid immersion cooling apparatus according to the first embodiment. FIG. 5 schematically illustrates a cross-sectional view of the major part of an example of the liquid immersion cooling apparatus. FIGS. 6A to 6C schematically illustrate cross-sectional perspective views of the major part of an example of the sealing tank of the liquid immersion cooling apparatus.

Various cables are connected to the electronic device 2 immersed in the refrigerant liquid 40 of the liquid immersion tank 10 of the liquid immersion cooling apparatus 1. In the liquid immersion cooling apparatus 1, for example, as illustrated in FIG. 5, a cable 2a connected to the electronic device 2 in the refrigerant liquid 40 is drawn out to the gas phase portion 13 of the liquid immersion tank 10, and is further drawn out to one gas phase portion 23a of the sealing tank 20 through the vent hole 50 and the vent hole 51 corresponding to the vent hole 50. Then, the cable 2a is drawn out from one gas phase portion 23a to the other gas phase portion 23b of the sealing tank 20 by passing below the partition member 24 of the sealing material 60, and is further drawn out from the other gas phase portion 23b to the outside of the apparatus through the vent hole 52. In the liquid immersion cooling apparatus 1 as described above, the vent hole 50 in the liquid immersion tank 10, the vent holes 51 and 52 in the sealing tank 20, and the space below the partition member 24 of the sealing tank 20 are used, and the cable 2a connected to the electronic device 2 immersed in the refrigerant liquid 40 is drawn out to the outside of the apparatus. Since the sealing material 60 is interposed between the gas phase portion 23a of the sealing tank 20 which communicates with the gas phase portion 13 of the liquid immersion tank 10 and the gas phase portion 23b which communicates with the outside of the apparatus, it is possible to draw out the cable 2a to the outside while preventing the refrigerant vapor generated in the liquid immersion tank 10 from being exited to the outside of the apparatus. The sealing tank 20 of the liquid immersion cooling apparatus 1 is also referred to as a cable box.

In the liquid immersion cooling apparatus 1, for example, a wiring path, through which the cable 2a to be drawn out from the liquid immersion tank 10 to the outside of the apparatus as described above may pass, is provided between the partition member 24 in the sealing material 60 and the bottom portion 21a of the sealing tank main body 21. FIGS. 6A to 6C illustrate examples of the wiring path, respectively. FIGS. 6A to 6C schematically illustrate cross-sectional perspective views of the major part when viewing the partition member 24 and the other gas phase portion 23a side from one gas phase portion 23b side of the sealing tank 20 (e.g., when viewing the left side from the paper right side of FIG. 5), respectively. Moreover, in FIGS. 6A to 6C, the sealing material 60 is not illustrated.

In the liquid immersion cooling apparatus 1, for example, as illustrated in FIG. 6A, the partition member 24 is provided such that the lower end 24aa is positioned at a predetermined height from the bottom portion 21a of the sealing tank main body 21. A gap 25 formed between the bottom portion 21a of the sealing tank main body 21 and the lower end 24aa of the partition member 24 is used as the wiring path, and the cable 2a passes through the gap 25.

Further, in the liquid immersion cooling apparatus 1, for example, as illustrated in FIG. 6B, the partition member 24 may be provided such that a notch 26 is provided in a portion of the edge portion on the lower end 24aa side and the lower end 24aa other than the notch 26 is in contact with the bottom portion 21a of the sealing tank main body 21. The notch 26 provided in the partition member 24 is used as the wiring path, and the cable 2a passes through the notch 26.

In addition, in the liquid immersion cooling apparatus 1, for example, as illustrated in FIG. 6C, the partition member 24 may be provided such that a through-hole 27 is provided in a portion of the edge portion on the lower end 24aa side. The through-hole 27 provided in the partition member 24 is used as the wiring path, and the cable 2a passes through the through-hole 27.

For example, the height of the gap 25 (FIG. 6A) from the bottom portion 21a of the sealing tank main body 21, the height and width of the notch 26 (FIG. 6B) from the bottom portion 11a, and the diameter of the through-hole 27 (FIG. 6C) are adjusted such that the cross-sectional area of the wiring path is reduced. In this way, movement of the sealing material 60 from the area on the gas phase portion 23a side with respect to the partition member 24 to the area on the gas phase portion 23b side and the resulting heat transfer are difficult to occur. Thus, temperature rise of the sealing material 60 present in the area on the gas phase portion 23b side, the resulting evaporation, and exhaust of vapor generated by evaporation to the outside of the apparatus may be prevented.

Figure 7:
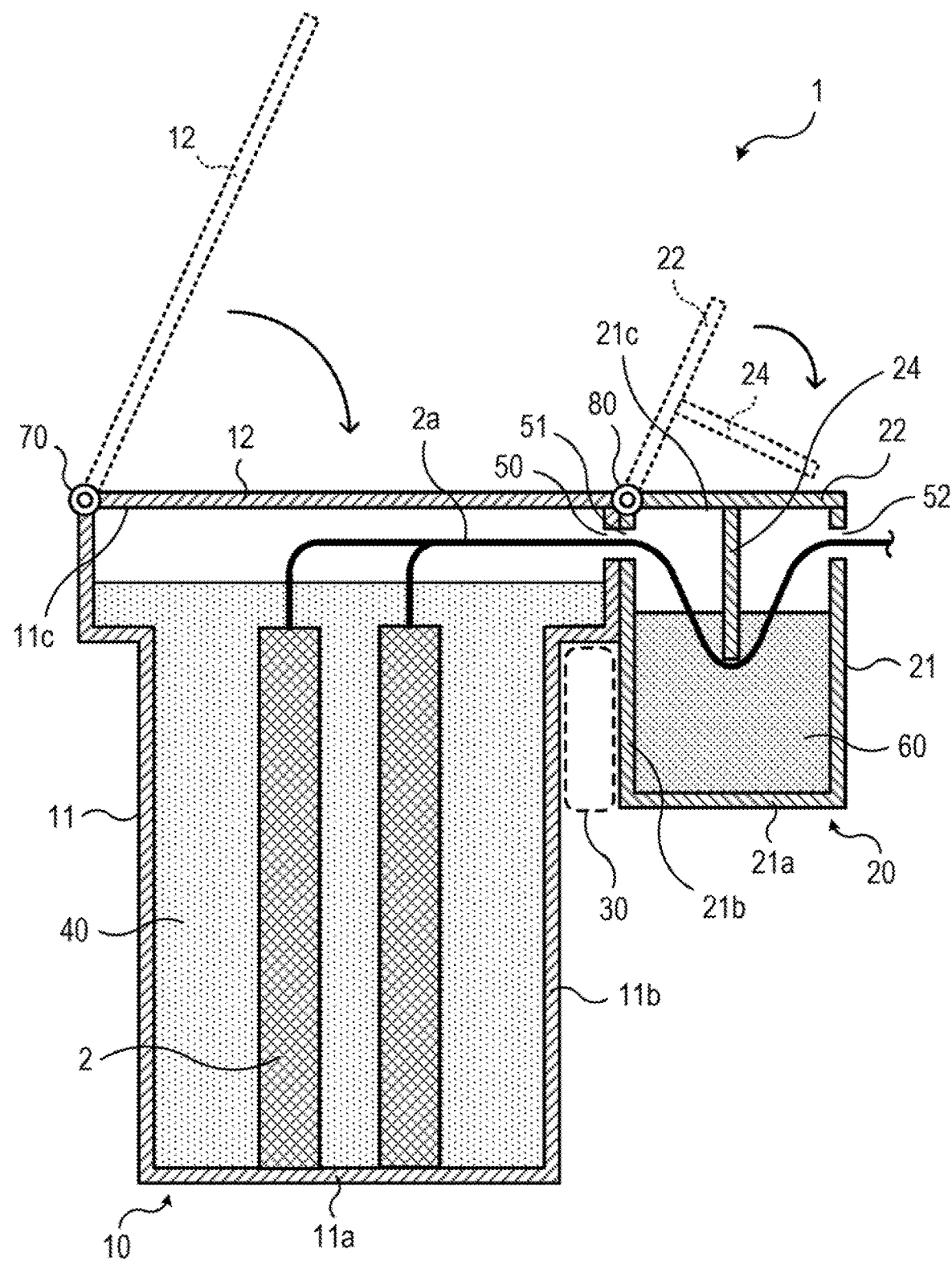
FIG. 7 is a diagram illustrating a third configuration example of the liquid immersion cooling apparatus according to the first embodiment.

FIG. 7 is a diagram illustrating a third configuration example of the liquid immersion cooling apparatus according to the first embodiment. FIG. 7 schematically illustrates a cross-sectional view of the major part of an example of the liquid immersion cooling apparatus.

In the liquid immersion cooling apparatus 1, the lid body 12 of the liquid immersion tank 10 may be provided to open and close the opening 11c in the liquid immersion tank main body 11 by rotation thereof. For example, as illustrated in FIG. 7, one end of the lid body 12 and the upper end of the sidewall 11b of the liquid immersion tank main body 11 corresponding thereto are connected to each other by a hinge element 70. When the lid body 12 is rotated about the hinge element 70, the opening 11c in the liquid immersion tank main body 11 is opened and closed.

In FIG. 7, the lid body 12 is illustrated by a dotted line in a state where the opening 11c in the liquid immersion tank main body 11 is opened. In a state where the opening 11c is opened, the refrigerant liquid 40 is supplied to the liquid immersion tank main body 11 and the electronic device 2 is carried into and immersed in the refrigerant liquid 40. From the open state of the opening 11c, when the lid body 12 is rotated in the direction of a solid line arrow about the hinge element 70, the opening 11c in the liquid immersion tank main body 11 is closed.

Similarly, the lid body 22 of the sealing tank 20 may be provided to open and close the opening 21c in the sealing tank main body 21 by rotation thereof. For example, as illustrated in FIG. 7, one end of the lid body 22 provided with the partition member 24 and the upper end of the sidewall 21b of the sealing tank main body 21 corresponding thereto are connected to each other by a hinge element 80. When the lid body 22 provided with the partition member 24 is rotated integrally with the partition member 24 about the hinge element 80, the opening 21c in the sealing tank main body 21 is opened and closed.

In FIG. 7, the lid body 22 and the partition member 24 are illustrated by dotted lines in a state where the opening 21c in the sealing tank main body 21 is opened. In a state where the opening 21c is opened, the sealing material 60 in a liquid or liquid phase state is supplied to the sealing tank main body 21, and the cable 2a connected to the electronic device 2 passes through the vent hole 50 and the vent hole 51 and further passes through the vent hole 52. From this state, when the lid body 12 and the partition member 24 are rotated in the direction of a solid line arrow about the hinge element 80, the opening 21c in the sealing tank main body 21 is closed. At this time, the cable 2a is pushed by the partition member 24 and is immersed in the sealing material 60 in a liquid phase state.

In this way, the lid body 12 of the liquid immersion tank 10 may employ a method of opening and closing the liquid immersion tank main body 11 by rotation thereof. Further, the lid body 22 of the sealing tank 20 may employ a method of opening and closing the sealing tank main body 21 by being rotated integrally with the partition member 24. Moreover, both the lid body 12 and the lid body 22 may not need to employ an opening and closing method by such rotation thereof.

Second Embodiment

Figure 8:
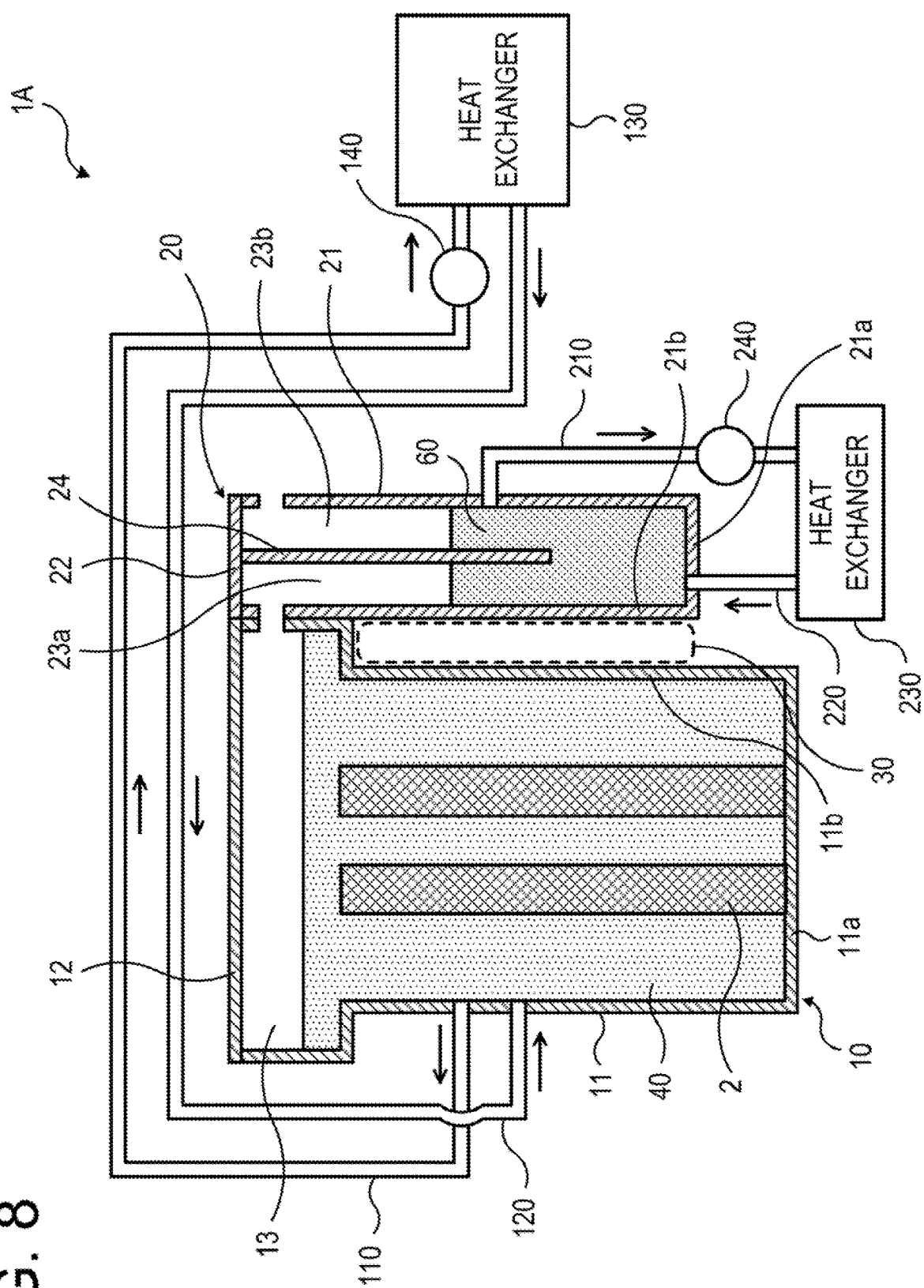
FIG. 8 is a diagram illustrating an example of a liquid immersion cooling apparatus according to a second embodiment.

FIG. 8 is a diagram illustrating an example of a liquid immersion cooling apparatus according to a second embodiment. FIG. 8 schematically illustrates a configuration example of the liquid immersion cooling apparatus.

The liquid immersion cooling apparatus 1A illustrated in FIG. 8 includes the liquid immersion tank 10, the sealing tank 20, and the heat insulating portion 30 provided therebetween. In the liquid immersion cooling apparatus 1A, the liquid immersion tank 10, the sealing tank 20, and the heat insulating portion 30 are the same elements as those described in the first embodiment. The refrigerant liquid 40 is accommodated in the liquid immersion tank main body 11, and the electronic device 2 is immersed in the refrigerant liquid 40. The sealing tank main body 21 accommodates the sealing material 60 in a liquid phase state, for example, the same kind of sealing material 60 as the refrigerant liquid 40. Moreover, the cable 2a connected to the electronic device 2 is not illustrated. Further, the heat insulating portion 30 may be made into the hollow portion 31 (FIG. 4A) or the heat insulating material 32 (FIG. 4B) as described above.

The liquid immersion cooling apparatus 1A illustrated in FIG. 8 includes a pipe 110 and a pipe 120 connected to the liquid immersion tank main body 11, a heat exchanger 130 connected to the pipes, and a pump 140 provided on one pipe 110. The pipe 110 and the pipe 120 function as a flow path through which the refrigerant liquid 40 flows, and the heat exchanger 130 functions as a cooler that cools the refrigerant liquid 40. The liquid immersion cooling apparatus 1A further includes a pipe 210 and a pipe 220 connected to the sealing tank main body 21, a heat exchanger 230 connected to the pipes, and a pump 240 provided on one pipe 210. The pipe 210 and the pipe 220 function as a flow path through which the sealing material 60 in a liquid phase state flows, and the heat exchanger 230 functions as a cooler that cools the sealing material 60 in a liquid phase state.

In the liquid immersion cooling apparatus 1A, the heat generated from the electronic device 2 in the refrigerant liquid 40 accommodated in the liquid immersion tank 10 is transferred to the refrigerant liquid 40. The refrigerant liquid 40 is discharged from the liquid immersion tank 10 (immersion tank main body 11) through the pipe 110 by the pump 140 and is sent to the heat exchanger 130. The refrigerant liquid 40 sent to the heat exchanger 130 is cooled by the heat exchanger 130. The refrigerant liquid 40 cooled in the heat exchanger 130 is returned to the liquid immersion tank 10 (liquid immersion tank main body 11) through the pipe 120. In the liquid immersion cooling apparatus 1A, the refrigerant liquid 40 is circulated as described above, the refrigerant liquid 40 to which heat is transferred from the electronic device 2 is cooled, and temperature rise of the refrigerant liquid 40 is prevented.

In the liquid immersion cooling apparatus 1A, the sealing material 60 of the sealing tank 20 in a liquid phase state is discharged from the sealing tank 20 (sealing tank main body 21) through the pipe 210 by the pump 240 and is sent to the heat exchanger 230. The sealing material 60 sent to the heat exchanger 230 is cooled by the heat exchanger 230. The sealing material 60 cooled in the heat exchanger 230 is returned to the sealing tank 20 (sealing tank main body 21) through the pipe 220. In the liquid immersion cooling apparatus 1A, the sealing material 60 is circulated as described above, and temperature rise of the sealing material 60 is prevented.

As described above, in the liquid immersion cooling apparatus 1A, the heat insulating portion 30 is provided between the liquid immersion tank 10 and the sealing tank 20. Thus, the heat transferred from the electronic device 2 to the refrigerant liquid 40 is prevented from being transferred to the sealing material 60 through the liquid immersion tank main body 11 and the sealing tank main body 21 and temperature rise of the sealing material 60 is prevented. Furthermore, the sealing material 60 of the sealing tank 20 is discharged through the pipe 210, is cooled in the heat exchanger 230, and is returned to the sealing tank 20 through the pipe 220. By the circulation of the sealing material 60 described above, the sealing material 60 is cooled, and temperature rise of the sealing material 60 of the sealing tank 20 is prevented. By the heat insulating portion 30 and the circulation of the sealing material 60, temperature rise of the sealing material 60 of the sealing tank 20 is prevented, and the reduction of the sealing material 60 due to evaporation and the resulting reduction of the refrigerant liquid 40 in the liquid immersion tank 10 are prevented.

According to the liquid immersion cooling apparatus 1A, it is possible to prevent a reduction of the sealing material 60 in the sealing tank 20 due to evaporation, to reduce the replenishment amount or replenishment frequency of the sealing material 60, and to reduce the costs associated with the replenishment. According to the liquid immersion cooling apparatus 1A, it is possible to prevent the reduction of the refrigerant liquid 40 in the liquid immersion tank 10 caused by the reduction of the sealing material 60 in the sealing tank 20 due to evaporation, to reduce the replenishment amount or replenishment frequency of the refrigerant liquid 40, and to reduce the costs associated with the replenishment. According to the liquid immersion cooling apparatus 1A, it is possible to prevent the reduction of the refrigerant liquid 40 in the liquid immersion tank 10 and sufficiently cool the electronic device 2 by preventing the electronic device 2 from being exposed from the refrigerant liquid 40.

Third Embodiment

Figure 9:
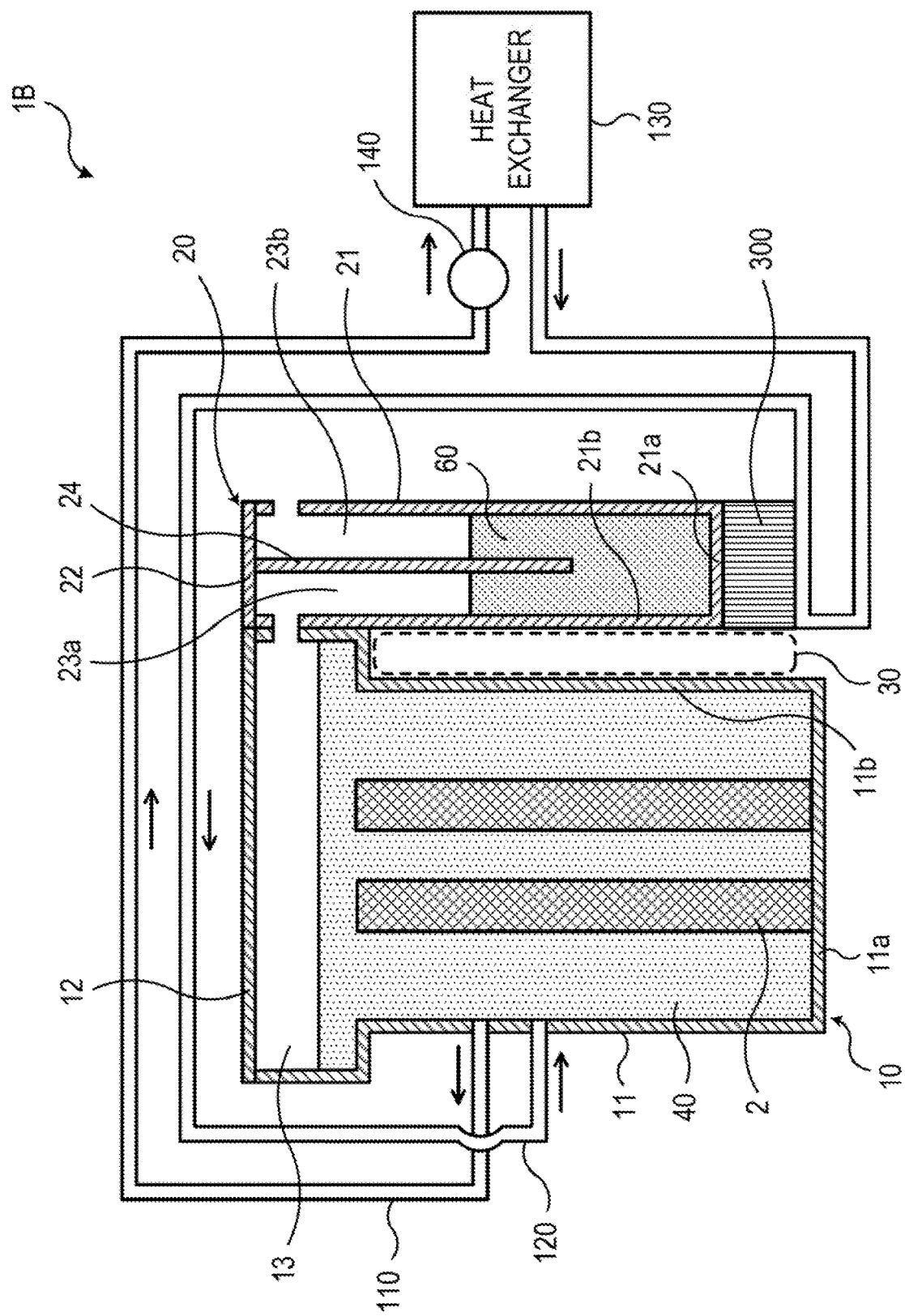
FIG. 9 is a diagram illustrating a first example of a liquid immersion cooling apparatus according to a third embodiment.

FIG. 9 is a diagram illustrating a first example of a liquid immersion cooling apparatus according to a third embodiment. FIG. 9 schematically illustrates a configuration example of the liquid immersion cooling apparatus.

The liquid immersion cooling apparatus 1B illustrated in FIG. 9 includes the liquid immersion tank 10, the sealing tank 20, the heat insulating portion 30 provided therebetween, and a cooling plate 300 provided below the sealing tank 20 (outside the bottom portion 21a of the sealing tank main body 21).

In the liquid immersion cooling apparatus 1B, the liquid immersion tank 10, the sealing tank 20, and the heat insulating portion 30 are the same as those described in the first embodiment. The refrigerant liquid 40 is accommodated in the liquid immersion tank main body 11, and the electronic device 2 is immersed in the refrigerant liquid 40. The sealing tank main body 21 accommodates the sealing material 60 in a liquid phase state, for example, the same kind of sealing material 60 as the refrigerant liquid 40. Moreover, the cable 2a connected to the electronic device 2 is not illustrated. Further, the heat insulating portion 30 may be made into the hollow portion 31 (FIG. 4A) or the heat insulating material 32 (FIG. 4B) as described above.

In the liquid immersion cooling apparatus 1B, the cooling plate 300 functions as a cooling unit that cools the sealing tank main body 21 of the sealing tank 20 and the sealing material 60. The cooling plate 300 is formed of a material having a relatively high thermal conductivity such as a metal material including aluminum, copper, or stainless steel, or a carbon material such as carbon nanotube or graphene. For the cooling plate 300, a material having a higher thermal conductivity than the material used for the sealing tank main body 21 is used.

The liquid immersion cooling apparatus 1B illustrated in FIG. 9 includes the pipe 110 and the pipe 120 connected to the liquid immersion tank main body 11, the heat exchanger 130 connected to the pipes, and the pump 140 provided on one pipe 110. The pipe 110 and the pipe 120 function as a flow path through which the refrigerant liquid 40 flows, and the heat exchanger 130 functions as a cooler that cools the refrigerant liquid 40.

Figure 11A:
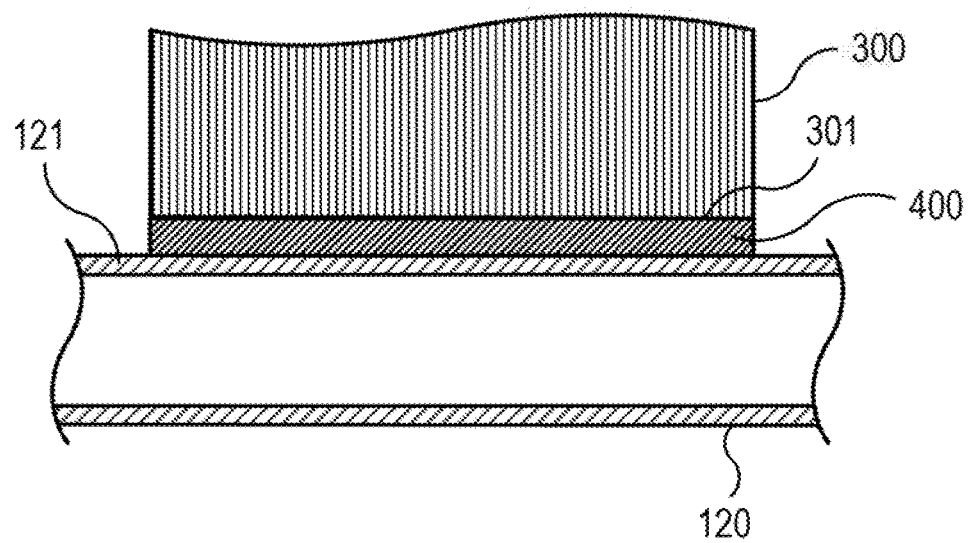
FIGS. 11A and 11B are diagrams illustrating the connection between a pipe and a cooling plate of the liquid immersion cooling apparatus according to the third embodiment.

In the liquid immersion cooling apparatus 1B, a portion of the pipe 120 which interconnects the heat exchanger 130 and the liquid immersion tank main body 11 is thermally connected to the cooling plate 300 provided under the sealing tank 20. The pipe 120 is connected to the lower surface of the cooling plate 300, for example. The pipe 120 may be connected to the side surface of the cooling plate 300, rather than being limited to the lower surface of the cooling plate 300. A material having a relatively high thermal conductivity may be used for at least a portion of the pipe 120 connected to the cooling plate 300. Moreover, the connection between the pipe 120 and the cooling plate 300 in the liquid immersion cooling apparatus 1B will be described later (FIG. 11A).

In the liquid immersion cooling apparatus 1B, by providing the heat insulating portion 30 between the liquid immersion tank 10 and the sealing tank 20, the heat transferred from the electronic device 2 to the refrigerant liquid 40 is prevented from being transferred to the sealing material 60 in the sealing tank 20 through the liquid immersion tank main body 11 and the sealing tank main body 21 and temperature rise of the sealing material 60 is prevented. In the liquid immersion cooling apparatus 1B, furthermore, the refrigerant liquid 40 of the liquid immersion tank 10 is discharged through the pipe 110, is cooled in the heat exchanger 130, and is returned to the liquid immersion tank 10 through the pipe 120. In this way, the pipe 120, through which the refrigerant liquid 40 cooled in the heat exchanger 130 and returned to the liquid immersion tank 10 flows, is thermally connected to the cooling plate 300 under the sealing tank 20. Thus, the heat of the cooling plate 300 is transferred to the refrigerant liquid 40 flowing through the pipe 120, and the cooling plate 300 is cooled. By cooling the cooling plate 300, the heat of the sealing tank main body 21 and the sealing material 60 in the sealing tank 20 is transferred to the cooling plate 300, the sealing material 60 of the sealing tank 20 is cooled, and temperature rise of the sealing material 60 is prevented.

As described above, in the liquid immersion cooling apparatus 1B, the heat insulating portion 30, the refrigerant liquid 40 cooled by the heat exchanger 130, and the cooling plate 300 are used, and temperature rise of the sealing material 60 of the sealing tank 20 is prevented. Thus, the reduction of the sealing material 60 in the sealing tank 20 due to evaporation and the resulting reduction of the refrigerant liquid 40 in the liquid immersion tank 10 are prevented.

According to the liquid immersion cooling apparatus 1B, it is possible to prevent the reduction of the sealing material 60 in the sealing tank 20 due to evaporation, to reduce the replenishment amount or replenishment frequency of the sealing material 60, and to reduce the costs associated with the replenishment. According to the liquid immersion cooling apparatus 1B, it is possible to prevent the reduction of the refrigerant liquid 40 of the liquid immersion tank 10 caused by the reduction of the sealing material 60 of the sealing tank 20 due to evaporation, to reduce the replenishment amount or replenishment frequency of the refrigerant liquid 40, and to reduce the costs associated with the replenishment. According to the liquid immersion cooling apparatus 1B, it is possible to prevent the reduction of the refrigerant liquid 40 in the liquid immersion tank 10 and sufficiently cool the electronic device 2 by preventing the electronic device 2 from being exposed from the refrigerant liquid 40.

Figure 10:
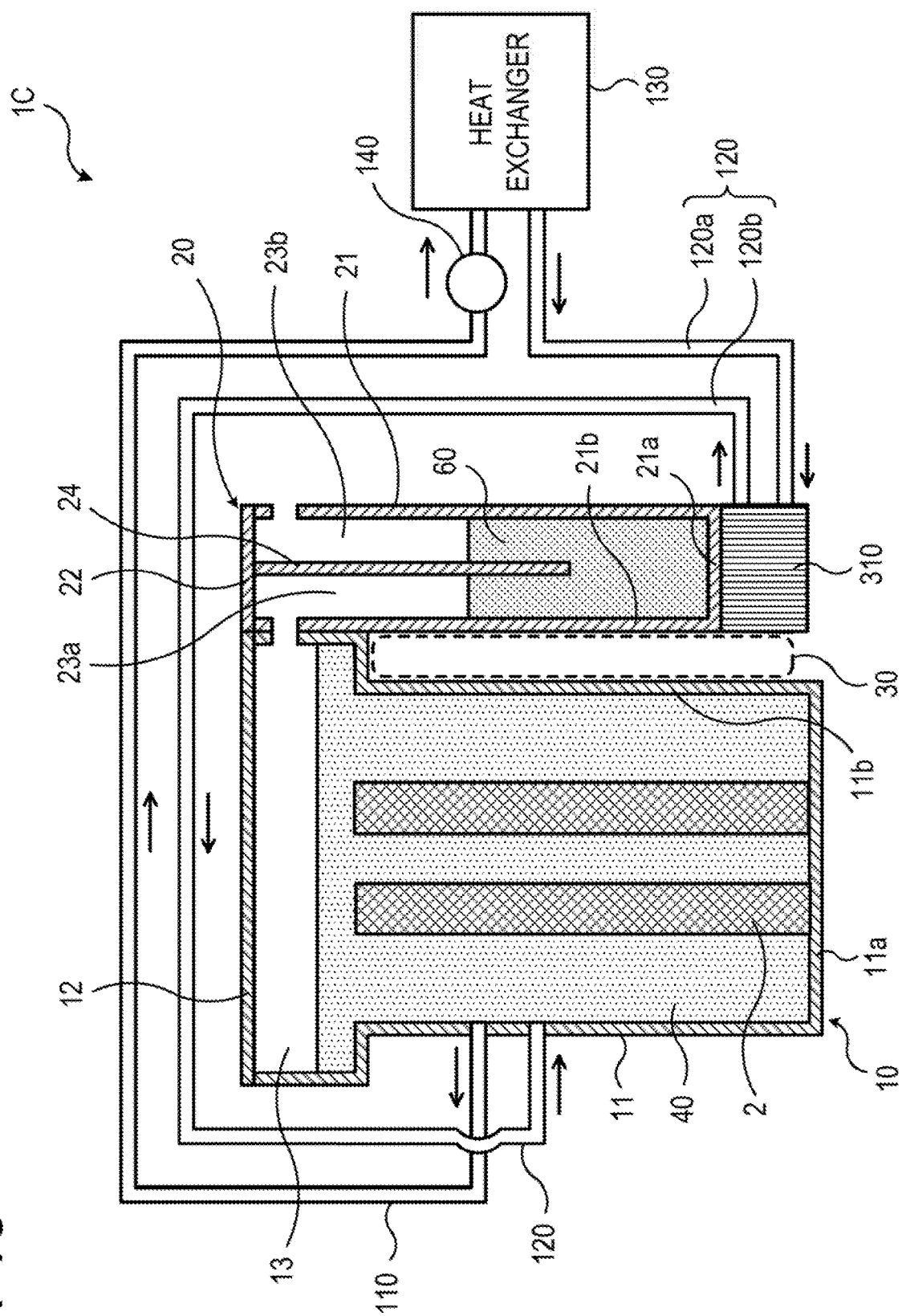
FIG. 10 is a diagram illustrating a second example of the liquid immersion cooling apparatus according to the third embodiment.

FIG. 10 is a diagram illustrating a second example of the liquid immersion cooling apparatus according to the third embodiment. FIG. 10 schematically illustrates a configuration example of the liquid immersion cooling apparatus.

Figure 11B:
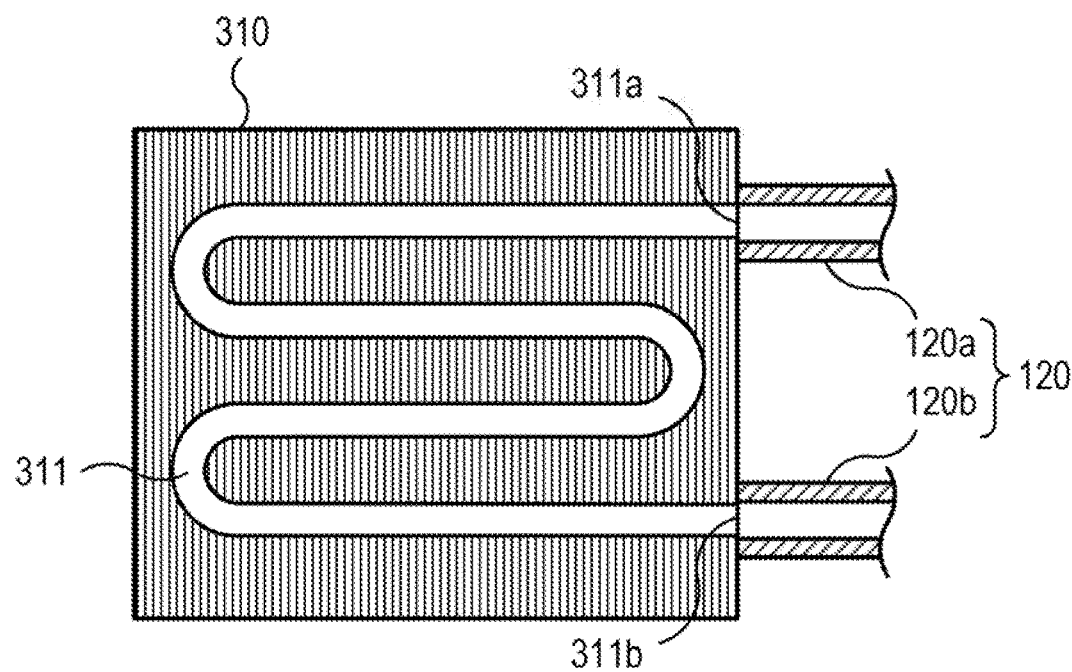

In the liquid immersion cooling apparatus 1C illustrated in FIG. 10, a cooling plate 310 having a flow path therein is provided under the sealing tank 20, and the flow path (an inlet and an outlet) thereof is connected to the pipe 120 (a pipe 120a and a pipe 120b) through which the refrigerant liquid 40 cooled by the heat exchanger 130 and returned to the liquid immersion tank 10 flows. Alternatively, a portion of the pipe 120 (a portion between the pipe 120a and the pipe 120b) may be provided to be thermally connected to the cooling plate 310 and pass through the inside of the cooling plate 310. In this case, a material having a relatively high thermal conductivity may be used for at least the portion of the pipe 120 which passes through the inside of the cooling plate 310. The liquid immersion cooling apparatus 1C is different from the liquid immersion cooling apparatus 1B (FIG. 9) in this respect. Moreover, the connection between the pipe 120 and the cooling plate 310 in the liquid immersion cooling apparatus 1C will be described later (FIG. 11B).

In the liquid immersion cooling apparatus 1C, the heat of the cooling plate 310 is transferred to the refrigerant liquid 40 which flows through the flow path provided inside the cooling plate 310 or a portion of the pipe 120 passing through the inside of the cooling plate 310, and the cooling plate 310 is cooled. By cooling the cooling plate 310, the heat of the sealing tank main body 21 and the sealing material 60 in the sealing tank 20 is transferred to the cooling plate 310, the sealing material 60 of the sealing tank 20 is cooled, and temperature rise of the sealing material 60 is prevented.

By the liquid immersion cooling apparatus 1C, the same effects as those described for the liquid immersion cooling apparatus 1B are obtained.

Here, the connection between the pipe 120 and the cooling plate 310 will be described.

FIGS. 11A and 11B are diagrams illustrating the connection between the pipe and the cooling plate of the liquid immersion cooling apparatus according to the third embodiment. FIGS. 11A and 11B schematically illustrate cross-sectional views of a connection portion between the pipe and the cooling plate, respectively.

In the liquid immersion cooling apparatus 1B illustrated in FIG. 9, a portion of the pipe 120 which interconnects the heat exchanger 130 and the liquid immersion tank main body 11 is thermally connected to the cooling plate 300 provided under the sealing tank 20 by a method illustrated in FIG. 11A, for example. That is, a pipe wall 121 of the pipe 120 and a lower surface 301 of the cooling plate 300 are bonded to each other via a bonding material 400 having a relatively high thermal conductivity. For the bonding material 400, for example, a conductive paste such as a silver paste or a solder paste or a thermal interface material (TIM) such as a thermal sheet or thermal grease may be used.

In addition, in a portion of the pipe 120 and the cooling plate 300, when at least the surfaces of the pipe wall 121 and the lower surface 301 are formed of a metal material, the pipe wall 121 and the lower surface 301 may be connected to each other by direct bonding (metal to metal bonding).

In the liquid immersion cooling apparatus 1B, by thermally interconnecting the pipe 120 and the cooling plate 300 by a method as in FIG. 11A, for example, the cooling plate 300 is cooled by the refrigerant liquid 40 flowing in the pipe 120.

Further, in the liquid immersion cooling apparatus 1C illustrated in FIG. 10, for example, the cooling plate 310 having provided therein a flow path 311 as illustrated in FIG. 11B is used. The divided pipes 120a and 120b of the pipe 120, through which the refrigerant liquid 40 cooled by the heat exchanger 130 and returned to the liquid immersion tank 10 flows, are connected respectively to an inlet 311a and an outlet 311b of the flow path 311 provided in the cooling plate 310. Moreover, the cross section of the cooling plate 310 as illustrated in FIG. 11B may be the cross section when the cooling plate 310 is cut along the plane direction thereof, or may be the cross section when the cooling plate 310 is cut along the thickness direction thereof. Further, the layout of the flow path 311 provided inside the cooling plate 310 is not limited to the example of FIG. 11B.

In addition, in the liquid immersion cooling apparatus 1C illustrated in FIG. 10, a portion of the pipe 120 may pass through the inside of the cooling plate 310. For example, a hole corresponding to the flow path 311 is provided in the cooling plate 310, and a portion of the pipe 120 is disposed along the hole.

In the liquid immersion cooling apparatus 1C, by thermally interconnecting the pipe 120 and the cooling plate 310 by a method as in FIG. 11B, for example, the cooling plate 310 is cooled by the refrigerant liquid 40 flowing in the cooling plate 310.

As in the liquid immersion cooling apparatus 1B and the liquid immersion cooling apparatus 1C, the cooling plate 300 and the cooling plate 310 may be cooled using the refrigerant liquid 40 cooled by the heat exchanger 130, whereby the sealing material 60 may be cooled and evaporation of the sealing material 60 may be prevented.

Further, in the liquid immersion cooling apparatus 1B and the liquid immersion cooling apparatus 1C, according to the example of the liquid immersion cooling apparatus 1A (FIG. 8), a cooling mechanism may further be provided to circulate and cool the sealing material 60 of the sealing tank 20. That is, each of the liquid immersion cooling apparatus 1B and the liquid immersion cooling apparatus 1C may be provided with the pipe 210 and the pipe 220 connected to the sealing tank main body 21, the heat exchanger 230 connected to the pipes, and the pump 240 provided on one pipe 210. By providing such a cooling mechanism, the temperature rise and evaporation of the sealing material 60 may be more effectively prevented.

Fourth Embodiment

Figure 12:
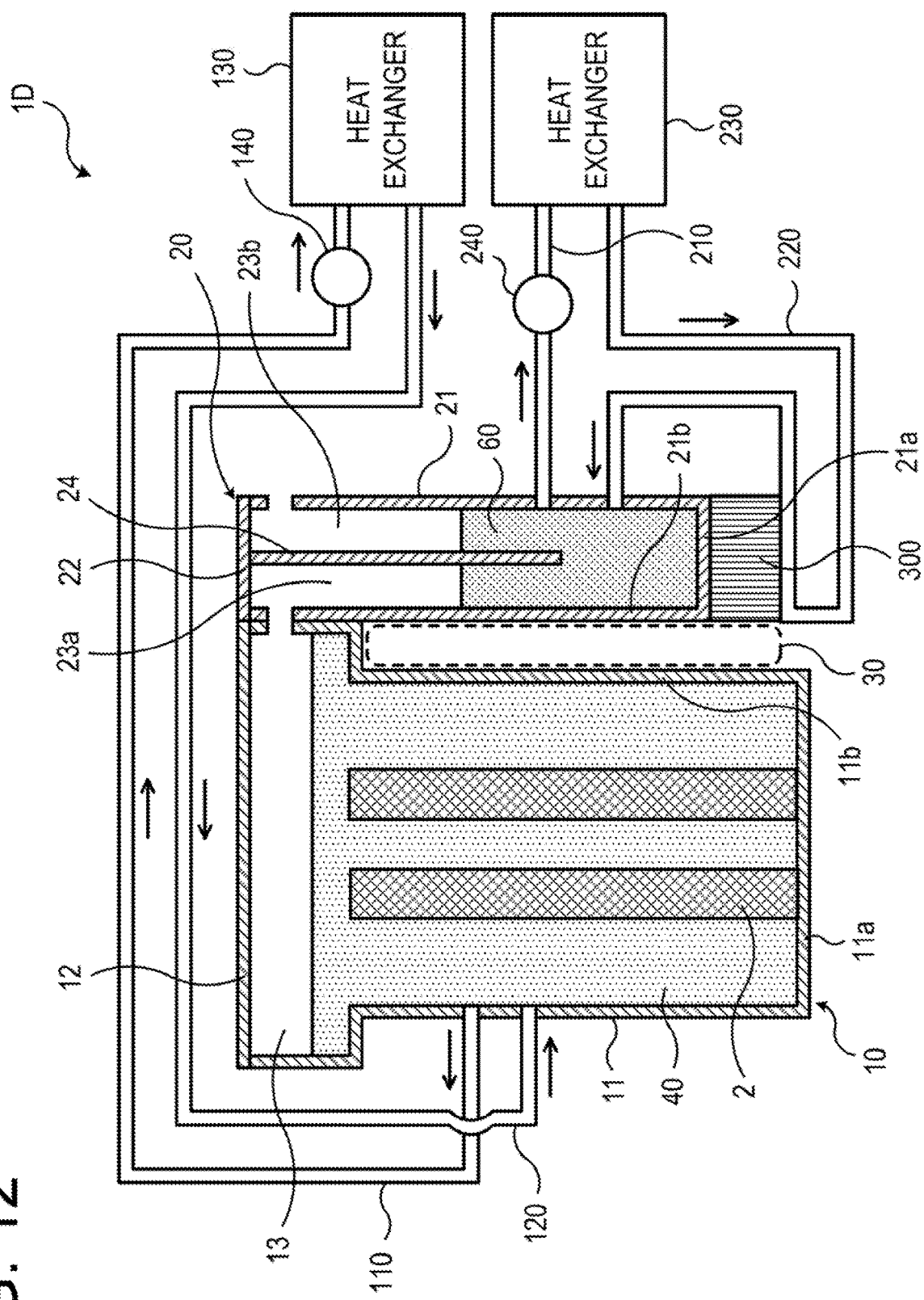
FIG. 12 is a diagram illustrating a first example of a liquid immersion cooling apparatus according to a fourth embodiment.

FIG. 12 is a diagram illustrating a first example of a liquid immersion cooling apparatus according to a fourth embodiment. FIG. 12 schematically illustrates a configuration example of the liquid immersion cooling apparatus.

The liquid immersion cooling apparatus 1D illustrated in FIG. 12 has a configuration that includes the pipe 210 and the pipe 220 connected to the liquid immersion tank main body 21, the heat exchanger 230 connected to the pipes, and the pump 240 provided on one pipe 210, and the pipe 220 is thermally connected to the cooling plate 300. The liquid immersion cooling apparatus 1D is different from the liquid immersion cooling apparatus 18 (FIGS. 9 and 11A) in that the liquid immersion cooling apparatus 1D has the configuration described above.

In the liquid immersion cooling apparatus 1D, by providing the heat insulating portion 30 between the liquid immersion tank 10 and the sealing tank 20, the heat transferred from the electronic device 2 to the refrigerant liquid 40 is prevented from being transferred to the sealing material 60 of the sealing tank 20 through the liquid immersion tank main body 11 and the sealing tank main body 21 and temperature rise of the sealing material 60 is prevented. In the liquid immersion cooling apparatus 1D, furthermore, the sealing material 60 of the sealing tank 20 in a liquid phase state is discharged through the pipe 210, is cooled in the heat exchanger 230, and is returned to the sealing tank 20 through the pipe 220. The pipe 210 and the pipe 220 function as a flow path through which the sealing material 60 flows, and the heat exchanger 230 functions as a cooler that cools the sealing material 60. The pipe 220, through which the sealing material 60 cooled by the heat exchanger 230 and returned to the sealing tank 20 flows, is thermally connected to the cooling plate 300 under the sealing tank 20. Thus, the heat of the cooling plate 300 is transferred to the sealing material 60 flowing through the pipe 220, and the cooling plate 300 is cooled. The heat of the sealing tank main body 21 and the sealing material 60 in the sealing tank 20 is transferred to the cooling plate 300, whereby the sealing material 60 of the sealing tank 20 is cooled and temperature rise of the sealing material 60 is prevented.

The liquid immersion cooling apparatus 1D may have a configuration in which the sealing material 60 flowing through the pipe 220 flows the inside of the cooling plate 300 of the liquid immersion cooling apparatus 1D according to the example of the cooling plate 310 of the liquid immersion cooling apparatus 1C (FIGS. 10 and 11B). With this configuration, the cooling plate 300 is cooled, the sealing material 60 of the sealing tank 20 is cooled, and temperature rise of the sealing material 60 is prevented.

In the liquid immersion cooling apparatus 1D, the heat insulating portion 30, the sealing material 60 cooled by the heat exchanger 230, and the cooling plate 300 are used, and temperature rise of the sealing material 60 of the sealing tank 20 is prevented. Thus, the reduction of the sealing material 60 in the sealing tank 20 due to evaporation and the resulting reduction of the refrigerant liquid 40 in the liquid immersion tank 10 are prevented.

According to the liquid immersion cooling apparatus 1D, it is possible to prevent the reduction of the sealing material 60 in the sealing tank 20 due to evaporation, to reduce the replenishment amount or replenishment frequency of the sealing material 60, and to reduce the costs associated with the replenishment. According to the liquid immersion cooling apparatus 1D, it is possible to prevent the reduction of the refrigerant liquid 40 in the liquid immersion tank 10 caused by the reduction of the sealing material 60 in the sealing tank 20 due to evaporation, to reduce the replenishment amount or replenishment frequency of the refrigerant liquid 40, and to reduce the costs associated with the replenishment. According to the liquid immersion cooling apparatus 1D, it is possible to prevent the reduction of the refrigerant liquid 40 in the liquid immersion tank 10 and to sufficiently cool the electronic device 2 by preventing the electronic device 2 from being exposed from the refrigerant liquid 40.

Figure 13:
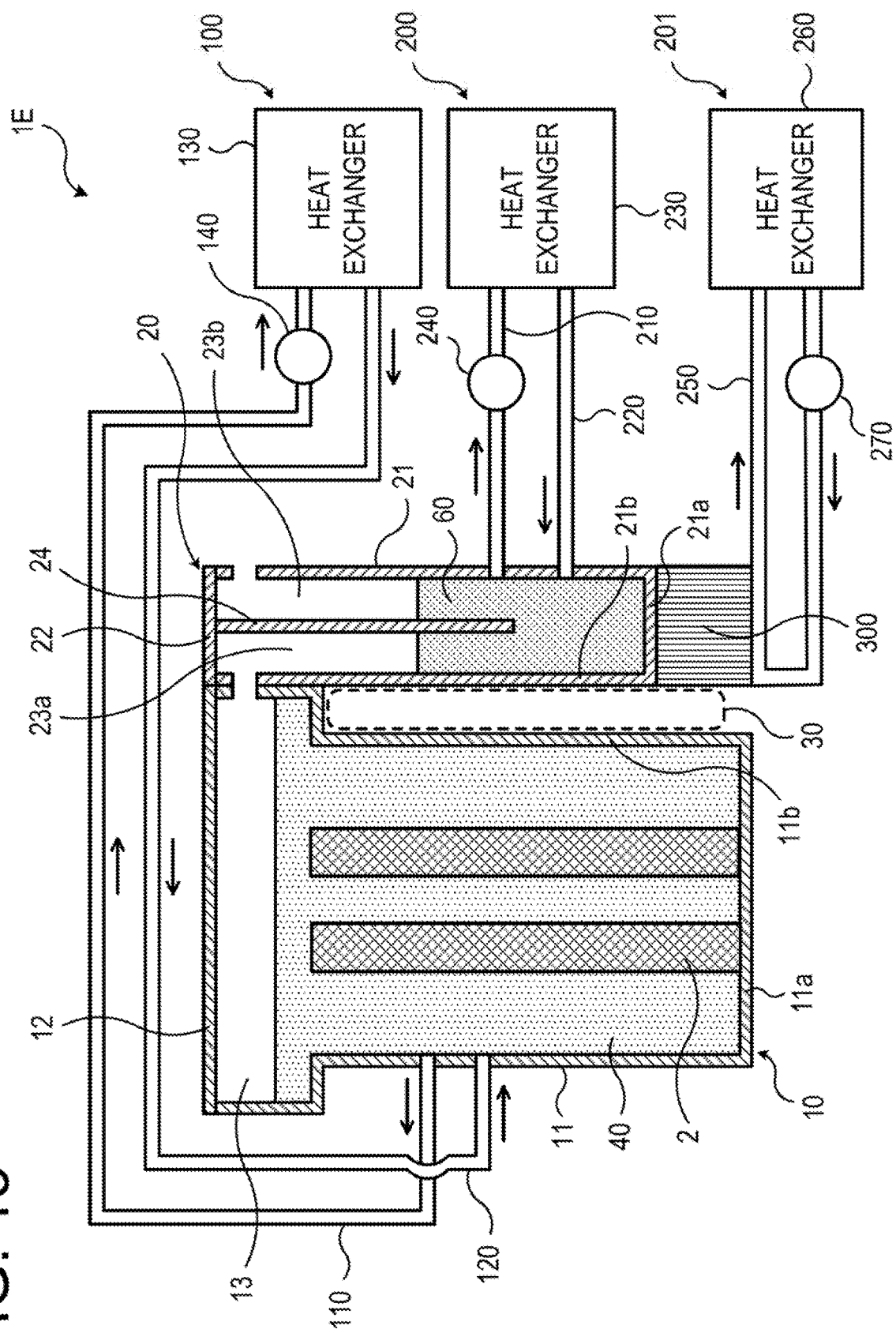
FIG. 13 is a diagram illustrating a second example of the liquid immersion cooling apparatus according to the fourth embodiment.

FIG. 13 is a diagram illustrating a second example of the liquid immersion cooling apparatus according to the fourth embodiment. FIG. 13 schematically illustrates a configuration example of the liquid immersion cooling apparatus.

The liquid immersion cooling apparatus 1E illustrated in FIG. 13 is different from the liquid immersion cooling apparatus 1D (FIG. 12) in that the liquid immersion cooling apparatus 1E has a configuration in which a cooling mechanism 201 for cooling the cooling plate 300 is provided under the sealing tank 20 separately from a cooling mechanism 200 for cooling the sealing material 60 of the sealing tank 20.

In the liquid immersion cooling apparatus 1E, the refrigerant liquid 40 of the liquid immersion tank 10 is cooled by a cooling mechanism 100 including the pipe 110, the pump 140, the heat exchanger 130, and the pipe 120. Further, in the liquid immersion cooling apparatus 1E, the sealing material 60 of the sealing tank 20 in a liquid phase state is cooled by the cooling mechanism 200 including the pipe 210, the pump 240, the heat exchanger 230, and the pipe 220. In the liquid immersion cooling apparatus 1E, in addition to these cooling mechanisms 100 and 200, the cooling mechanism 201 including a pipe 250 thermally connected to the cooling plate 300, a heat exchanger 260 connected to the pipe 250, and a pump 270 provided on the pipe 250 is provided. For example, a predetermined refrigerant is sealed in the system of the cooling mechanism 201, the refrigerant is cooled by flowing through the heat exchanger 260 or by being phase-changed in the heat exchanger 260, and the cooled refrigerant is sent to the pipe 250. Thus, the cooling plate 300 thermally connected to the pipe 250 is cooled, and the sealing tank main body 21 and the sealing material 60 of the sealing tank 20 are cooled.

In the liquid immersion cooling apparatus 1E, the heat insulating portion 30, the refrigerant cooled in the heat exchanger 260, and the cooling plate 300 are used, and temperature rise of the sealing material 60 of the sealing tank 20 is prevented. Thus, the reduction of the sealing material 60 in the sealing tank 20 due to evaporation and the resulting reduction of the refrigerant liquid 40 in the liquid immersion tank 10 are prevented. By the liquid immersion cooling apparatus 1E, the same effects as those described for the liquid immersion cooling apparatus 1D are obtained.

Moreover, the liquid immersion cooling apparatus 1E may have a configuration in which the refrigerant flowing through the pipe 250 flows the inside of the cooling plate 300 according to the example of the liquid immersion cooling apparatus 1C (FIG. 10). Further, in the liquid immersion cooling apparatus 1E, when the sealing material 60 of the sealing tank 20 may be sufficiently cooled by the cooling mechanism 201, the cooling mechanism 200 (the pipe 210, the pump 240, the heat exchanger 230, and the pipe 220) may also be omitted.

Fifth Embodiment

Figure 14:
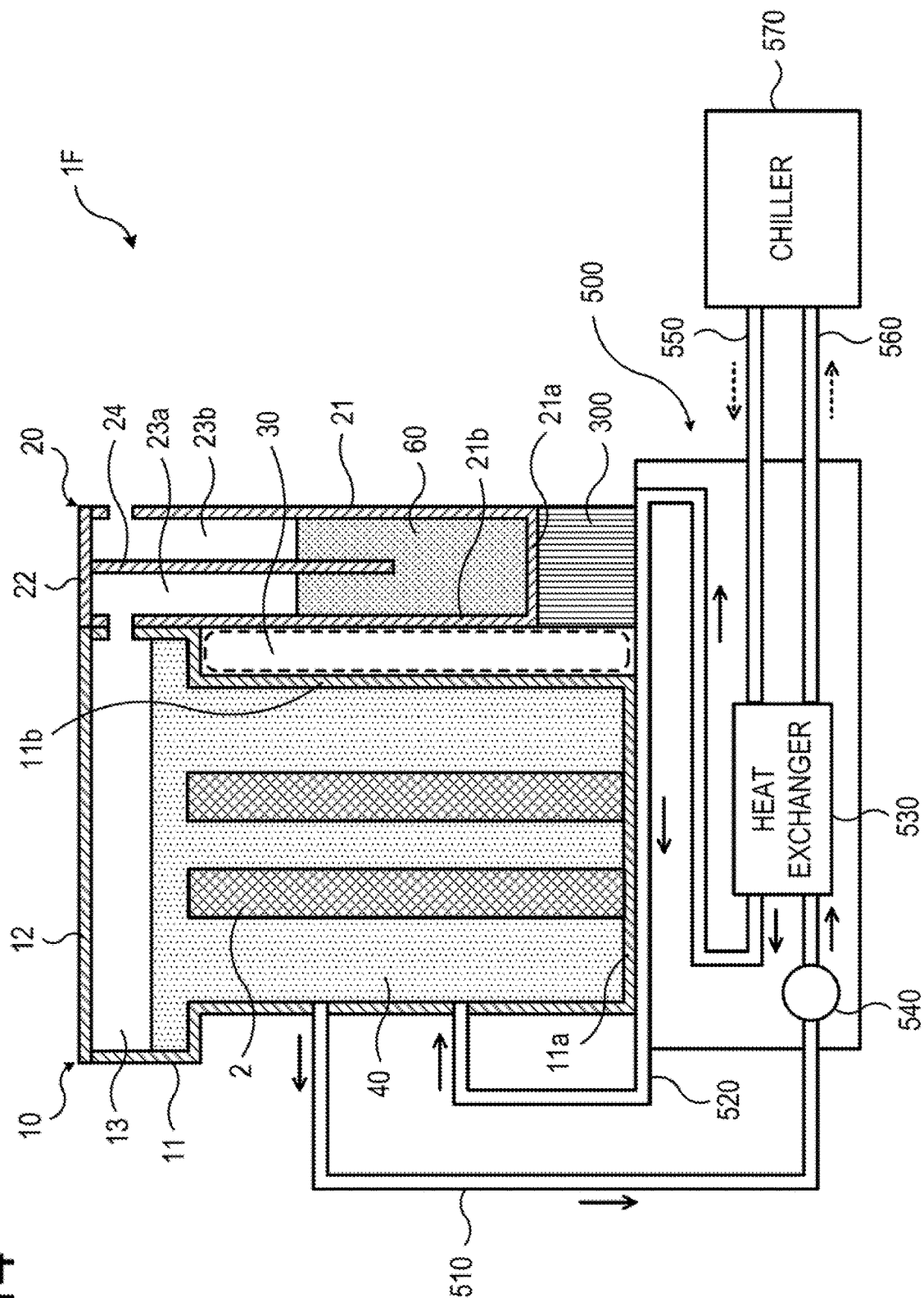
FIG. 14 is a diagram illustrating a first example of a liquid immersion cooling apparatus according to a fifth embodiment.

FIG. 14 is a diagram illustrating a first example of a liquid immersion cooling apparatus according to a fifth embodiment. FIG. 14 schematically illustrates a configuration example of the liquid immersion cooling apparatus.

The liquid immersion cooling apparatus 1F illustrated in FIG. 14 includes the liquid immersion tank 10, the sealing tank 20, the heat insulating portion 30 provided therebetween, the cooling plate 300 provided under the sealing tank 20, and a coolant distribution unit (CDU) 500.

In the liquid immersion cooling apparatus 1F, the liquid immersion tank 10, the sealing tank 20, and the heat insulating portion 30 are the same as those described in the first embodiment. The refrigerant liquid 40 is accommodated in the liquid immersion tank main body 11, and the electronic device 2 is immersed in the refrigerant liquid 40. The sealing tank main body 21 accommodates the sealing material 60 in a liquid phase state, for example, the same kind of sealing material 60 as the refrigerant liquid 40. Moreover, the cable 2a connected to the electronic device 2 is not illustrated. Further, the heat insulating portion 30 may be made into the hollow portion 31 (FIG. 4A) or the heat insulating material 32 (FIG. 4B) as described above. The cooling plate 300 is formed of a metal material, for example, and functions as a cooling unit that cools the sealing tank main body 21 and the sealing material 60 of the sealing tank 20.

The CDU 500 includes a pipe 510 and a pipe 520 connected to the liquid immersion tank main body 11, a heat exchanger 530 connected to the pipes, and a pump 540 provided on one pipe 510. The pipe 510 and the pipe 520 function as a flow path through which the refrigerant liquid 40 flows, and the heat exchanger 530 functions as a cooler that cools the refrigerant liquid 40. The CDU 500 further includes a pipe 550 and a pipe 560 connected to the heat exchanger 530, and a chiller 570 connected to the pipes. The pipe 550 and the pipe 560 function as a flow path through which a refrigerant such as water flows, and the chiller 570 functions as a cooler that cools the refrigerant. For the chiller 570, for example, a cooling system or a refrigeration system that cools the refrigerant using gas-liquid two-phase change (evaporation and condensation) of the refrigerant may be used.

In the liquid immersion cooling apparatus 1F, the refrigerant liquid 40 which cools the electronic device 2 that generates heat is discharged from the liquid immersion tank 10 (immersion tank main body 11) through the pipe 510 by the pump 540 and is sent to the heat exchanger 530. In the heat exchanger 530, the refrigerant liquid 40 sent to the heat exchanger 530 is heat-exchanged with and cooled by the refrigerant circulated through the pipe 550, the heat exchanger 530, and the pipe 560 using the chiller 570. The refrigerant liquid 40 cooled in the heat exchanger 530 is returned to the liquid immersion tank 10 (liquid immersion tank main body 11) through the pipe 520. In the liquid immersion cooling apparatus 1F, the refrigerant liquid 40 is circulated as described above, the refrigerant liquid 40 to which heat is transferred from the electronic device 2 is cooled, and temperature rise of the refrigerant liquid 40 is prevented. Moreover, in FIG. 14, the flow direction of the refrigerant liquid 40 in the pipe 510 and the pipe 520 is indicated by solid line arrows, and the flow direction of the refrigerant in the pipe 550 and the pipe 560 is indicated by dotted line arrows.

In the liquid immersion cooling apparatus 1F, the liquid immersion tank 10 and the cooling plate 300 under the sealing tank 20 which is adjacent to the liquid immersion tank 10 with the heat insulating portion 30 interposed therebetween are provided to be positioned on the pipe 520 connected to the outlet side of the heat exchanger 530 of the CDU 500. The pipe 520, through which the refrigerant liquid 40 cooled in the heat exchanger 530 flows, is thermally connected to the liquid immersion tank 10 and the cooling plate 300. The connection between the pipe 520 and the liquid immersion tank 10 (the bottom portion 11a of the liquid immersion tank main body 11) and the connection between the pipe 520 and the cooling plate 300 are performed by bonding using, for example, the thermally conductive bonding material 400 as illustrated in FIG. 11A.

In the liquid immersion cooling apparatus 1F, the liquid immersion tank 10 is disposed on the pipe 520 through which the refrigerant liquid 40 cooled in the heat exchanger 530 of the CDU 500 flows, so that the heat of the liquid immersion tank main body 11 and the refrigerant liquid 40 is transferred to the refrigerant liquid 40 flowing through the pipe 520, and the refrigerant liquid 40 of the liquid immersion tank 10 is cooled.

In the liquid immersion cooling apparatus 1F, furthermore, the cooling plate 300 is disposed on the pipe 520 through which the refrigerant liquid 40 cooled in the heat exchanger 530 of the CDU 500 flows, so that the heat of the cooling plate 300 is transferred to the refrigerant liquid 40 flowing through the pipe 520, and the cooling plate 300 is cooled. By cooling the cooling plate 300, the heat of the sealing tank main body 21 and the sealing material 60 of the sealing tank 20 is transferred to the cooling plate 300, and the sealing material 60 of the sealing tank 20 is cooled.

Further, in the liquid immersion cooling apparatus 1F, heat transfer from the liquid immersion tank 10 to the sealing tank 20 is prevented by providing the heat insulating portion 30 between the liquid immersion tank 10 and the sealing tank 20.

As described above, in the liquid immersion cooling apparatus 1F, the heat insulating portion 30, the refrigerant liquid 40 cooled in the CDU 500, and the cooling plate 300 are used, and temperature rise of the sealing material 60 of the sealing tank 20 is prevented. Thus, the reduction of the sealing material 60 in the sealing tank 20 due to evaporation and the resulting reduction of the refrigerant liquid 40 in the liquid immersion tank 10 are prevented.

According to the liquid immersion cooling apparatus 1F, it is possible to prevent the reduction of the sealing material 60 in the sealing tank 20 due to evaporation, to reduce the replenishment amount or replenishment frequency of the sealing material 60, and to reduce the costs associated with the replenishment. According to the liquid immersion cooling apparatus 1F, it is possible to prevent the reduction of the refrigerant liquid 40 in the liquid immersion tank 10 caused by the reduction of the sealing material 60 in the sealing tank 20 due to evaporation, to reduce the replenishment amount or replenishment frequency of the refrigerant liquid 40, and to reduce the costs associated with the replenishment. According to the liquid immersion cooling apparatus 1F, it is possible to prevent the reduction of the refrigerant liquid 40 in the liquid immersion tank 10 and to sufficiently cool the electronic device 2 by preventing the electronic device 2 from being exposed from the refrigerant liquid 40.

Figure 15:
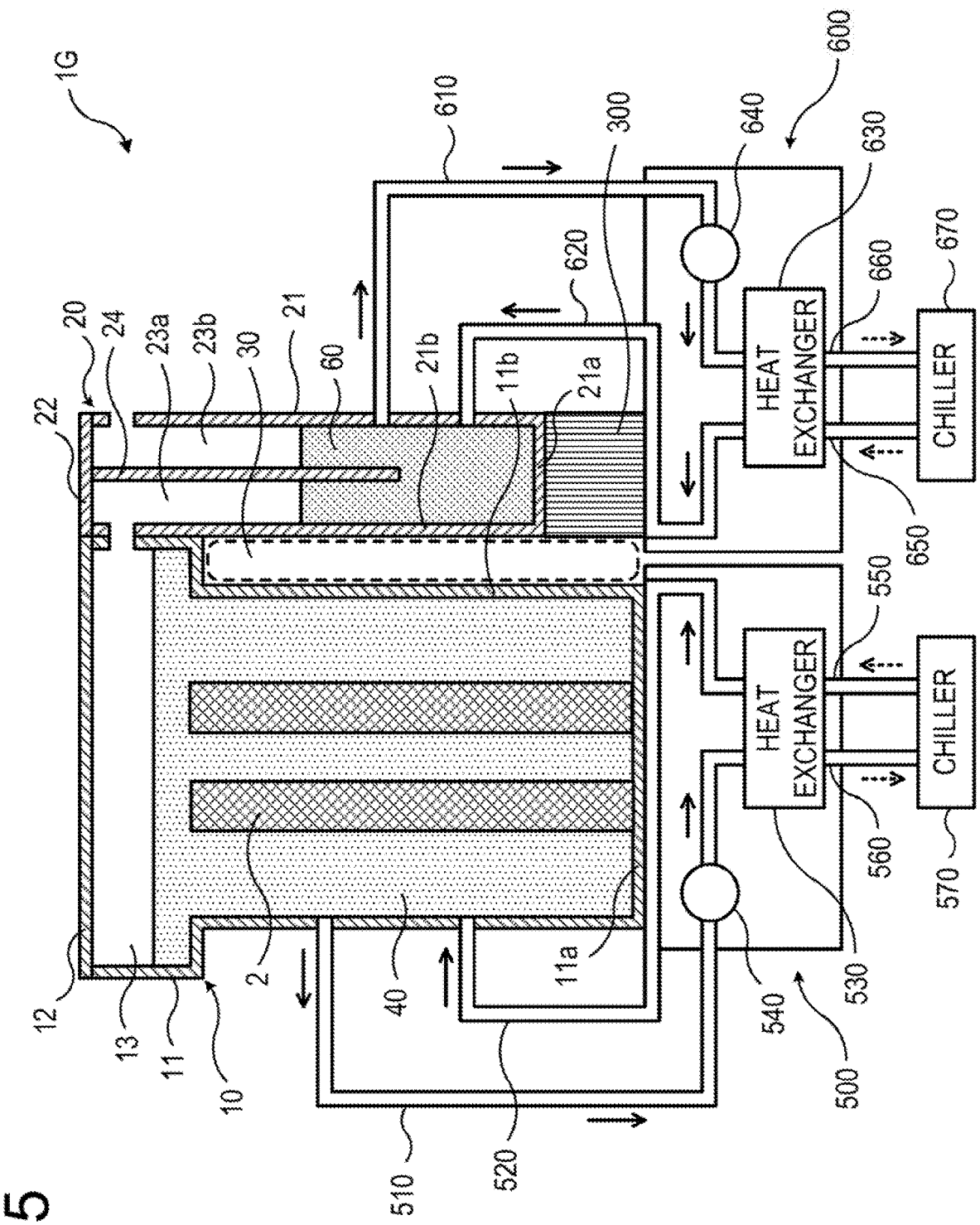
FIG. 15 is a diagram illustrating a second example of the liquid immersion cooling apparatus according to the fifth embodiment.

FIG. 15 is a diagram illustrating a second example of the liquid immersion cooling apparatus according to the fifth embodiment. FIG. 15 schematically illustrates a configuration example of the liquid immersion cooling apparatus.

The liquid immersion cooling apparatus 1G illustrated in FIG. 15 includes the CDU 500 which cools the refrigerant liquid 40 of the liquid immersion tank 10 and a CDU 600 which cools the sealing material 60 of the sealing tank 20.

The CDU 600 includes a pipe 610 and a pipe 620 connected to the sealing tank main body 21, a heat exchanger 630 connected to the pipes, and a pump 640 provided on one pipe 610. The pipe 610 and the pipe 620 function as a flow path through which the sealing material 60 in a liquid phase state flows, and the heat exchanger 630 functions as a cooler that cools the sealing material 60. The CDU 600 further includes a pipe 650 and a pipe 660 connected to the heat exchanger 630 and a chiller 670 connected to the pipes. The pipe 650 and the pipe 660 function as a flow path through which a refrigerant such as water flows, and the chiller 670 functions as a cooler that cools the refrigerant. For the chiller 670, for example, a cooling system or a refrigeration system that cools the refrigerant using gas-liquid two-phase change (evaporation and condensation) of the refrigerant may be used.

In the liquid immersion cooling apparatus 1G, the liquid immersion tank 10 is provided to be positioned on the pipe 520 connected to the outlet side of the heat exchanger 530 of the CDU 500. In the liquid immersion cooling apparatus 1G, the cooling plate 300 under the sealing tank 20 which is adjacent to the liquid immersion tank 10 with the heat insulating portion 30 interposed therebetween is provided to be positioned on the pipe 620 connected to the outlet side of the heat exchanger 630 of the CDU 600. The connection between the pipe 520 of the CDU 500 and the liquid immersion tank 10 (the bottom portion 11a of the liquid immersion tank main body 11) and the connection between the pipe 620 of the CDU 600 and the cooling plate 300 are performed by bonding using, for example, the thermally conductive bonding material 400 as illustrated in FIG. 11A.

In the liquid immersion cooling apparatus 1G, the liquid immersion tank 10 is disposed on the pipe 520 through which the refrigerant liquid 40 cooled in the heat exchanger 530 of the CDU 500 flows, so that the heat of the liquid immersion tank main body 11 and the refrigerant liquid 40 is transferred to the refrigerant liquid 40 flowing through the pipe 520, and the refrigerant liquid 40 of the liquid immersion tank 10 is cooled.

In the liquid immersion cooling apparatus 1G, furthermore, the cooling plate 300 is disposed on the pipe 620 through which the sealing material 60 cooled in the heat exchanger 630 of the CDU 600 flows, so that the heat of the cooling plate 300 is transferred to the sealing material 60 flowing through the pipe 620, and the cooling plate 300 is cooled. By cooling the cooling plate 300, the heat of the sealing tank main body 21 and the sealing material 60 of the sealing tank 20 is transferred to the cooling plate 300, and the sealing material 60 of the sealing tank 20 is cooled.

Further, in the liquid immersion cooling apparatus 1G, heat transfer from the liquid immersion tank 10 to the sealing tank 20 is prevented by providing the heat insulating portion 30 between the liquid immersion tank 10 and the sealing tank 20.

As described above, in the liquid immersion cooling apparatus 1G, the heat insulating portion 30, the sealing material 60 cooled in the CDU 600, and the cooling plate 300 are used, and temperature rise of the sealing material 60 of the sealing tank 20 is prevented. Thus, the reduction of the sealing material 60 in the sealing tank 20 due to evaporation and the resulting reduction of the refrigerant liquid 40 in the liquid immersion tank 10 are prevented.

According to the liquid immersion cooling apparatus 1G, it is possible to prevent the reduction of the sealing material 60 in the sealing tank 20 due to evaporation, to reduce the replenishment amount or replenishment frequency of the sealing material 60, and to reduce the costs associated with the replenishment. According to the liquid immersion cooling apparatus 1G, it is possible to prevent the reduction of the refrigerant liquid 40 in the liquid immersion tank 10 caused by the reduction of the sealing material 60 of the sealing tank 20 due to evaporation, to reduce the replenishment amount or replenishment frequency of the refrigerant liquid 40, and to reduce the costs associated with the replenishment. According to the liquid immersion cooling apparatus 1G, it is possible to prevent the reduction of the refrigerant liquid 40 in the liquid immersion tank 10 and to sufficiently cool the electronic device 2 by preventing the electronic device 2 from being exposed from the refrigerant liquid 40.

Sixth Embodiment

Figure 16:
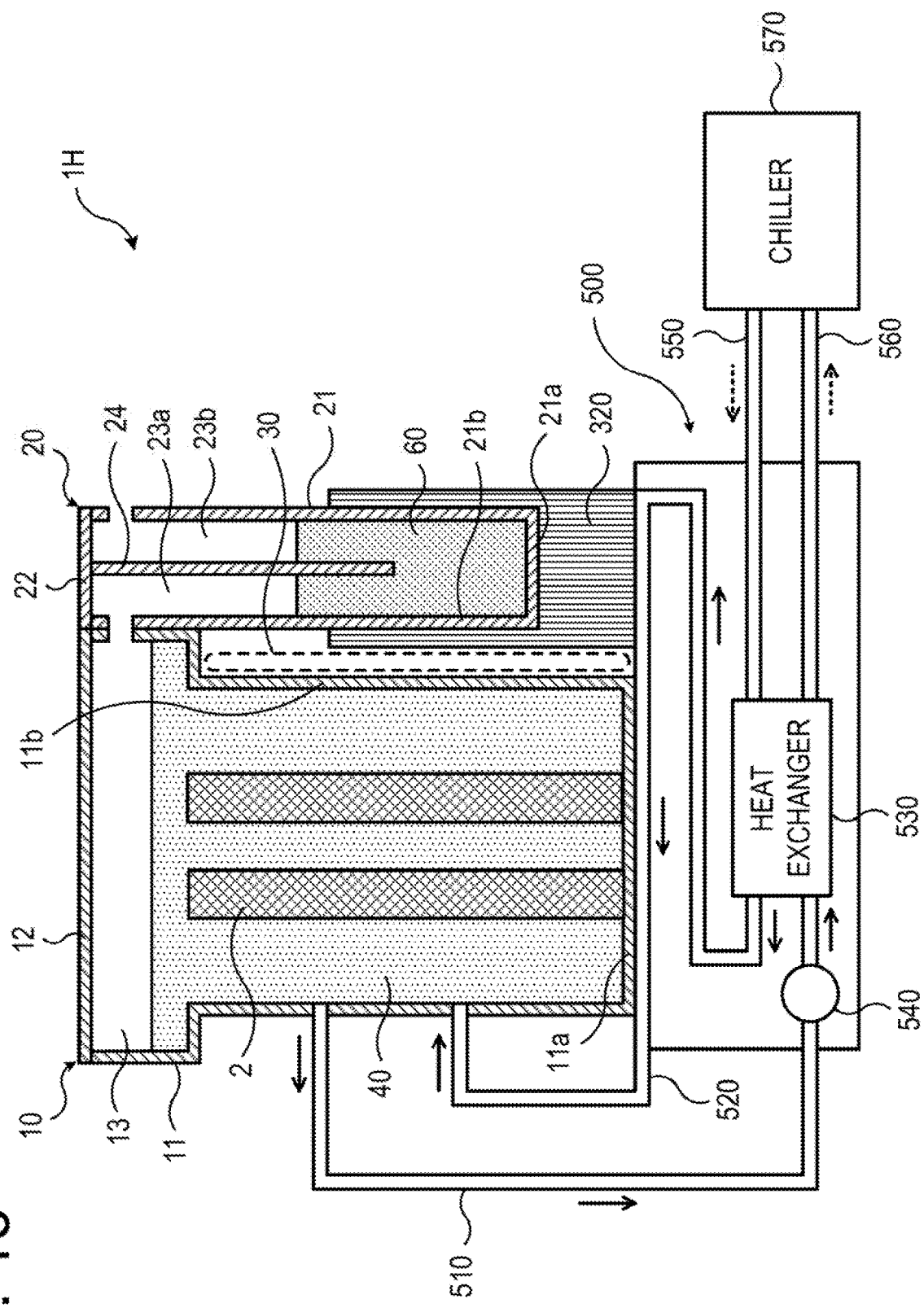
FIG. 16 is a diagram illustrating a first example of a liquid immersion cooling apparatus according to a sixth embodiment.

FIG. 16 is a diagram illustrating a first example of a liquid immersion cooling apparatus according to a sixth embodiment. FIG. 16 schematically illustrates a configuration example of the liquid immersion cooling apparatus.

The liquid immersion cooling apparatus 1H illustrated in FIG. 16 is different from the liquid immersion cooling apparatus 1F (FIG. 14) in that a cooling plate 320 is provided to cover the bottom portion 21a and a portion of the sidewall 21b of the sealing tank main body 21. In the liquid immersion cooling apparatus 1H, the heat insulating portion 30 is provided between the side surface of the cooling plate 320 and the sidewall 11b of the liquid immersion tank 10. The cooling plate 320 is formed of a material having a relatively high thermal conductivity such as a metal material similarly to the cooling plate 300, and functions as a cooling unit that cools the sealing tank main body 21 and the sealing material 60 of the sealing tank 20.

In the liquid immersion cooling apparatus 1H, the cooling plate 320 which covers the bottom portion 21a and a portion of the sidewall 21b of the sealing tank main body 21 is provided, so that the ability to cool the sealing tank main body 21 and the sealing material 60 may be enhanced. Therefore, it is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Figure 17:
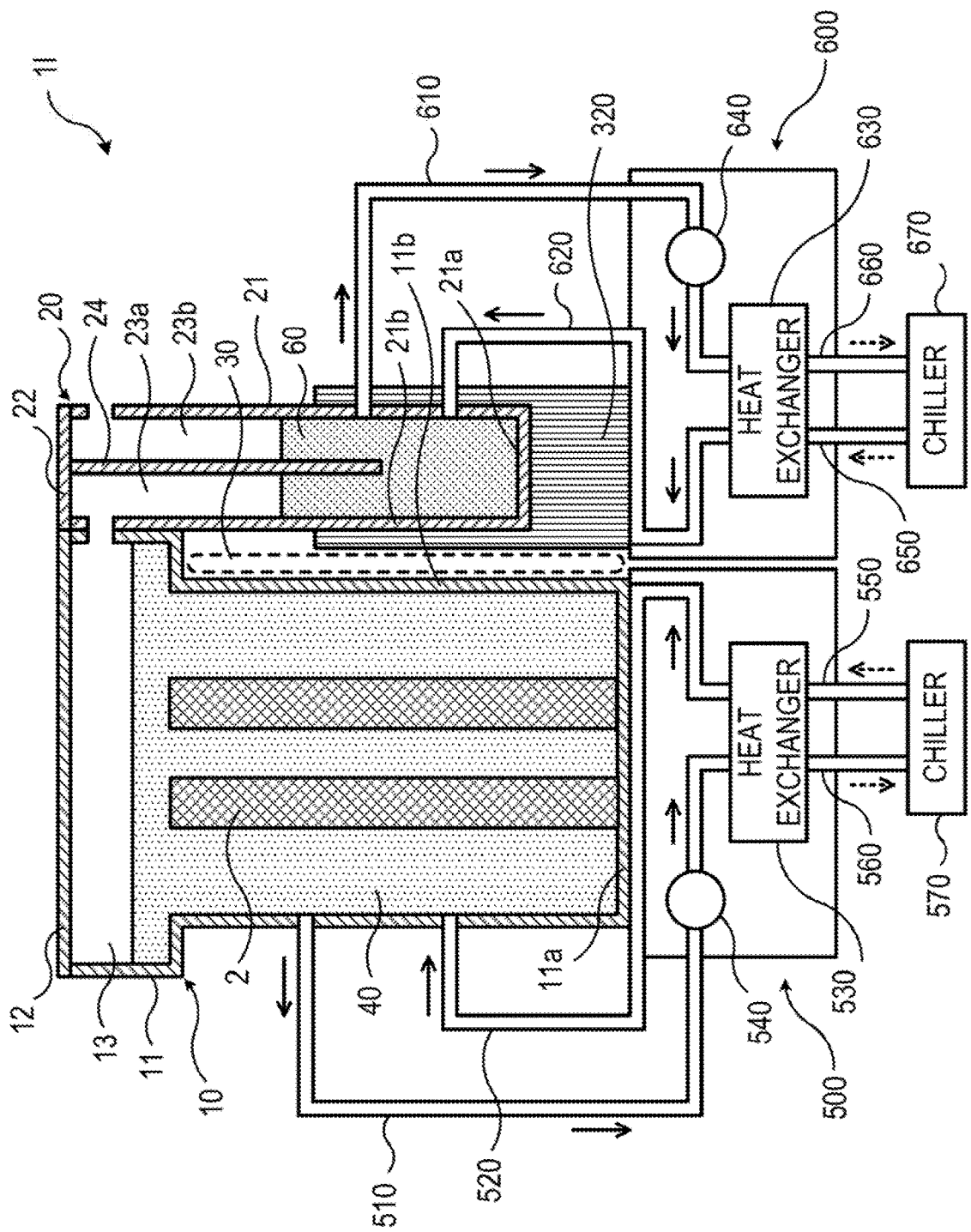
FIG. 17 is a diagram illustrating a second example of the liquid immersion cooling apparatus according to the sixth embodiment.

FIG. 17 is a diagram illustrating a second example of the liquid immersion cooling apparatus according to the sixth embodiment. FIG. 17 schematically illustrates a configuration example of the liquid immersion cooling apparatus.

The liquid immersion cooling apparatus 1I illustrated in FIG. 17 is different from the liquid immersion cooling apparatus 1G (FIG. 15) in that the cooling plate 320 is provided to cover the bottom portion 21a and a portion of the sidewall 21b of the sealing tank main body 21. In the liquid immersion cooling apparatus 1I, the heat insulating portion 30 is provided between the side surface of the cooling plate 320 and the sidewall 11b of the liquid immersion tank 10. The cooling plate 320 is formed of a material having a relatively high thermal conductivity such as a metal material, and functions as a cooling unit that cools the sealing tank main body 21 and the sealing material 60 of the sealing tank 20. The pipe 610 and the pipe 620 of the CDU 600 penetrate the cooling plate 320 and are connected to the sealing tank main body 21.

In the liquid immersion cooling apparatus 1I, the cooling plate 320 is provided to cover the bottom portion 21a and a portion of the sidewall 21b of the sealing tank main body 21, so that the ability to cool the sealing tank main body 21 and the sealing material 60 may be enhanced. Therefore, it is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Seventh Embodiment

Figure 18:
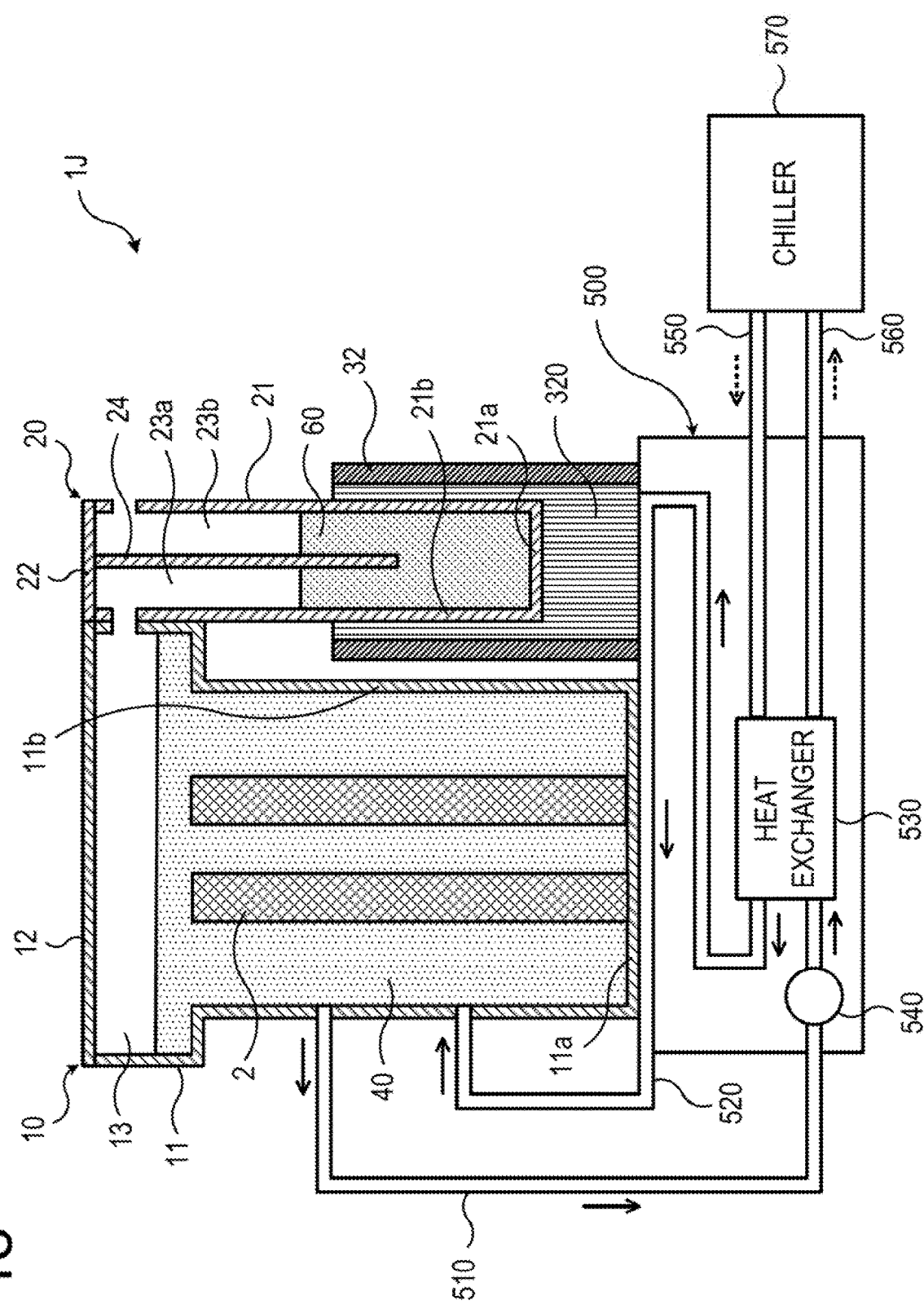
FIG. 18 is a diagram illustrating a first example of a liquid immersion cooling apparatus according to a seventh embodiment.

FIG. 18 is a diagram illustrating a first example of a liquid immersion cooling apparatus according to a seventh embodiment. FIG. 18 schematically illustrates a configuration example of the liquid immersion cooling apparatus.

The liquid immersion cooling apparatus 1J illustrated in FIG. 18 has a configuration in which the cooling plate 320 is provided to cover the bottom portion 21a and a portion of the sidewall 21b of the sealing tank main body 21 and a heat insulating material 32 is provided to cover the side surface of the cooling plate 320. The liquid immersion cooling apparatus 1J is one example in which the heat insulating material 32 is used as the heat insulating portion 30 in the liquid immersion cooling apparatus 1H (FIG. 16). In the heat insulating material 32 covering the side surface of the cooling plate 320, at least a portion thereof provided between the liquid immersion tank 10 and the sealing tank 20 functions as the heat insulating portion 30.

In the liquid immersion cooling apparatus 1J, the side surface of the cooling plate 320 is covered with the heat insulating material 32, so that the heat transferred from the sealing tank main body 21 and the sealing material 60 to the cooling plate 320 is efficiently transferred to the pipe 520 of the CDU 500 disposed under the cooling plate 320. Therefore, the ability to cool the sealing tank main body 21 and the sealing material 60 may be enhanced. It is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Figure 19:
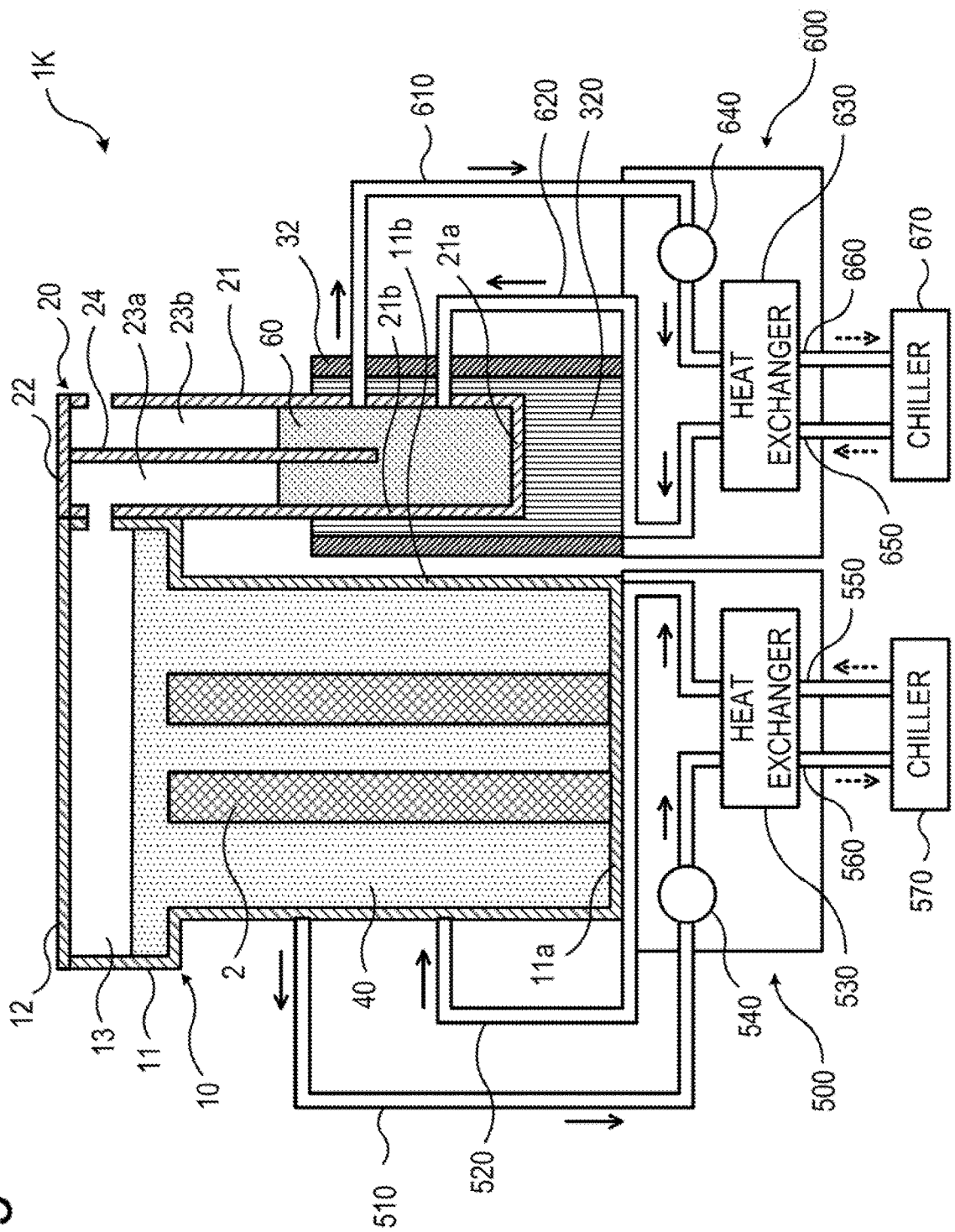
FIG. 19 is a diagram illustrating a second example of the liquid immersion cooling apparatus according to the seventh embodiment.

FIG. 19 is a diagram illustrating a second example of the liquid immersion cooling apparatus according to the seventh embodiment. FIG. 19 schematically illustrates a configuration example of the liquid immersion cooling apparatus.

The liquid immersion cooling apparatus 1K illustrated in FIG. 19 has a configuration in which the cooling plate 320 is provided to cover the bottom portion 21a and a portion of the sidewall 21b of the sealing tank main body 21 and the heat insulating material 32 is provided to cover the side surface of the cooling plate 320. The liquid immersion cooling apparatus 1K is one example in which the heat insulating material 32 is used as the heat insulating portion 30 in the liquid immersion cooling apparatus 1I (FIG. 17). In the heat insulating material 32 covering the side surface of the cooling plate 320, at least a portion thereof provided between the liquid immersion tank 10 and the sealing tank 20 functions as the heat insulating portion 30. The pipe 610 and the pipe 620 of the CDU 600 penetrate the cooling plate 320 and are connected to the sealing tank main body 21.

In the liquid immersion cooling apparatus 1K, the side surface of the cooling plate 320 is covered with the heat insulating material 32, so that the heat transferred from the sealing tank main body 21 and the sealing material 60 to the cooling plate 320 is efficiently transferred to the pipe 620 of the CDU 600 disposed under the cooling plate 320. Therefore, the ability to cool the sealing tank main body 21 and the sealing material 60 may be enhanced. It is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Eighth Embodiment

Figure 20:
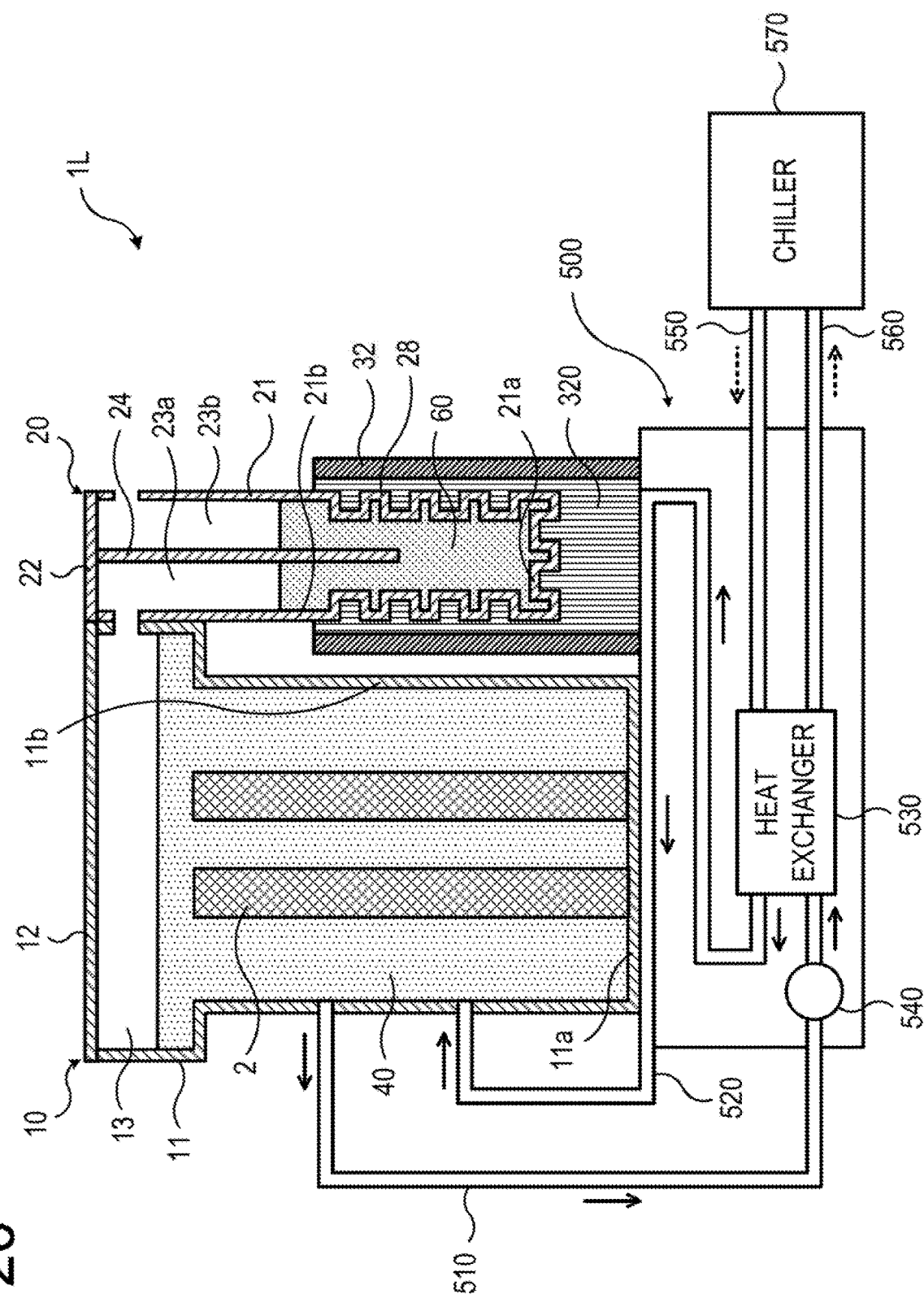
FIG. 20 is a diagram illustrating a first example of a liquid immersion cooling apparatus according to an eighth embodiment.

FIG. 20 is a diagram illustrating a first example of a liquid immersion cooling apparatus according to an eighth embodiment. FIG. 20 schematically illustrates a configuration example of the liquid immersion cooling apparatus.

The liquid immersion cooling apparatus 1L illustrated in FIG. 20 is different from the liquid immersion cooling apparatus 1J (FIG. 18) in that a fin 28 is provided on the bottom portion 21a and a portion of the sidewall 21b of the sealing tank main body 21. The fin 28 is an example of an uneven portion provided on the surface of the sealing tank main body 21 so as to increase the surface area thereof.

The sealing tank main body 21 having the fin 28 may be as illustrated in FIG. 20 in which the bottom portion 21a and a portion of the sidewall 21b are processed into a fin shape. Or, a separately formed fin-shaped member may be attached to the bottom portion 21a and a portion of the sidewall 21b. For example, when a metal material is used for the sealing tank main body 21, the sealing tank main body 21 having the fin 28 is formed using a method such as sheet metal working, grinding, welding, or adhesion. For example, when a resin material, or a carbon material, or a composite material thereof is used for the sealing tank main body 21, the sealing tank main body 21 having the fin 28 is formed using a method such as molding, grinding, welding, or adhesion.

In the liquid immersion cooling apparatus 1L, the fin 28 is provided on the sealing tank main body 21, so that the contact area of the sealing tank main body 21 and the cooling plate 320 is increased and the heat of the sealing tank main body 21 is efficiently transferred to the cooling plate 320. Therefore, the ability to cool the sealing tank main body 21 and the sealing material 60 may be enhanced. It is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Figure 21:
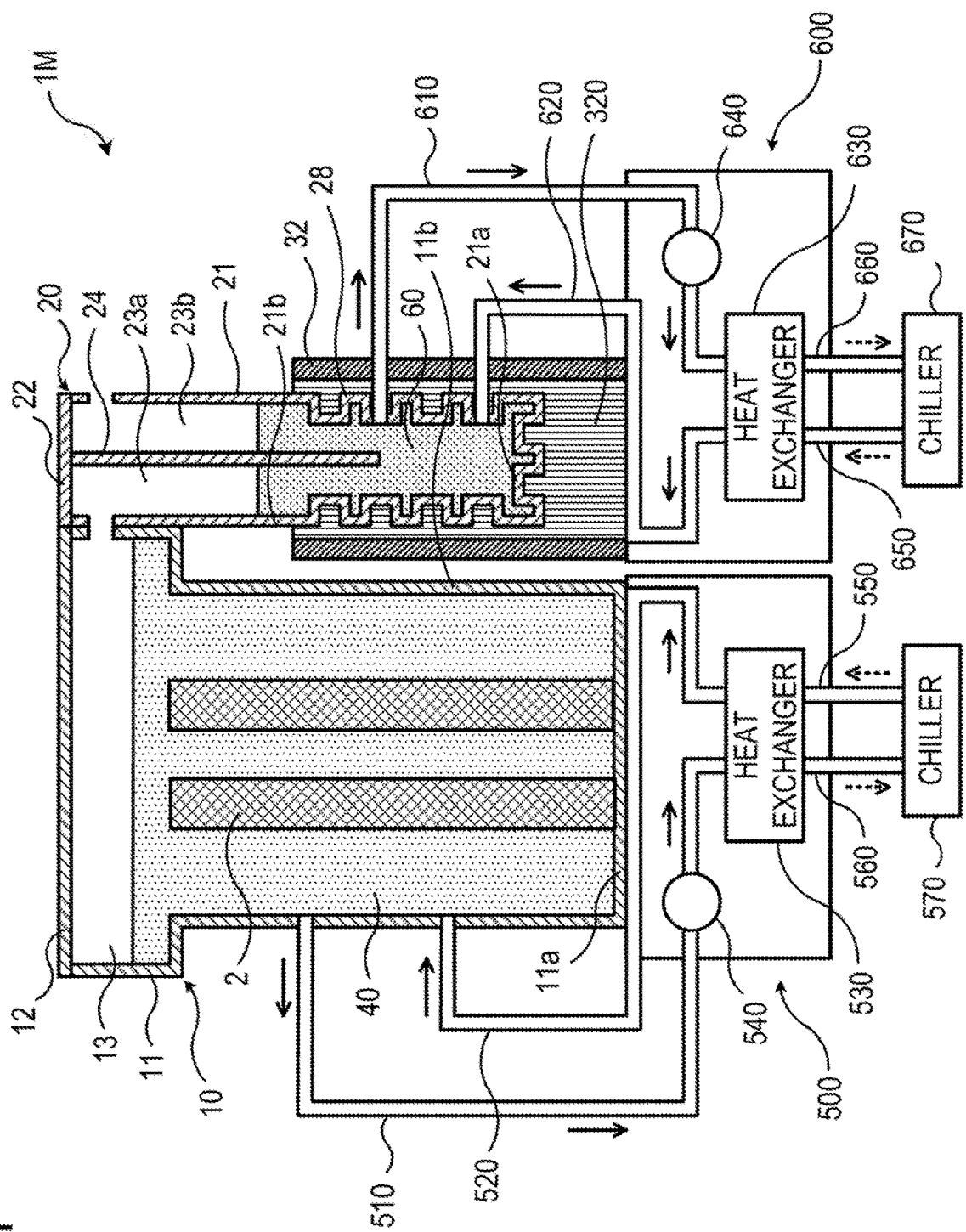
FIG. 21 is a diagram illustrating a second example of the liquid immersion cooling apparatus according to the eighth embodiment.

FIG. 21 is a diagram illustrating a second example of the liquid immersion cooling apparatus according to the eighth embodiment. FIG. 21 schematically illustrates a configuration example of the liquid immersion cooling apparatus.

The liquid immersion cooling apparatus 1M illustrated in FIG. 21 is different from the liquid immersion cooling apparatus 1K (FIG. 19) in that fin 28 is provided on the bottom portion 21a and a portion of the sidewall 21b of the sealing tank main body 21. The fin 28 is an example of an uneven portion provided on the surface of the sealing tank main body 21 so as to increase the surface area thereof.

The sealing tank main body 21 having the fin 28 may be as illustrated in FIG. 21 in which the bottom portion 21a and a portion of the sidewall 21b are processed into a fin shape. Or, a separately formed fin-shaped member may be attached to the bottom portion 21a and a portion of the sidewall 21b. For example, when a metal material is used for the sealing tank main body 21, the sealing tank main body 21 having the fin 28 is formed using a method such as sheet metal working, grinding, welding, or adhesion. For example, when a resin material, or a carbon material, or a composite material thereof is used for the sealing tank main body 21, the sealing tank main body 21 having the fin 28 is formed using a method such as molding, grinding, welding, or adhesion. The pipe 610 and the pipe 620 of the CDU 600 penetrate the heat insulating material 32 and the cooling plate 320 and are connected to the sealing tank main body 21.

In the liquid immersion cooling apparatus 1M, the fin 28 is provided on the sealing tank main body 21, so that the contact area of the sealing tank main body 21 and the cooling plate 320 is increased and the heat of the sealing tank main body 21 is efficiently transferred to the cooling plate 320. Therefore, the ability to cool the sealing tank main body 21 and the sealing material 60 may be enhanced. It is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Ninth Embodiment

Figure 22:
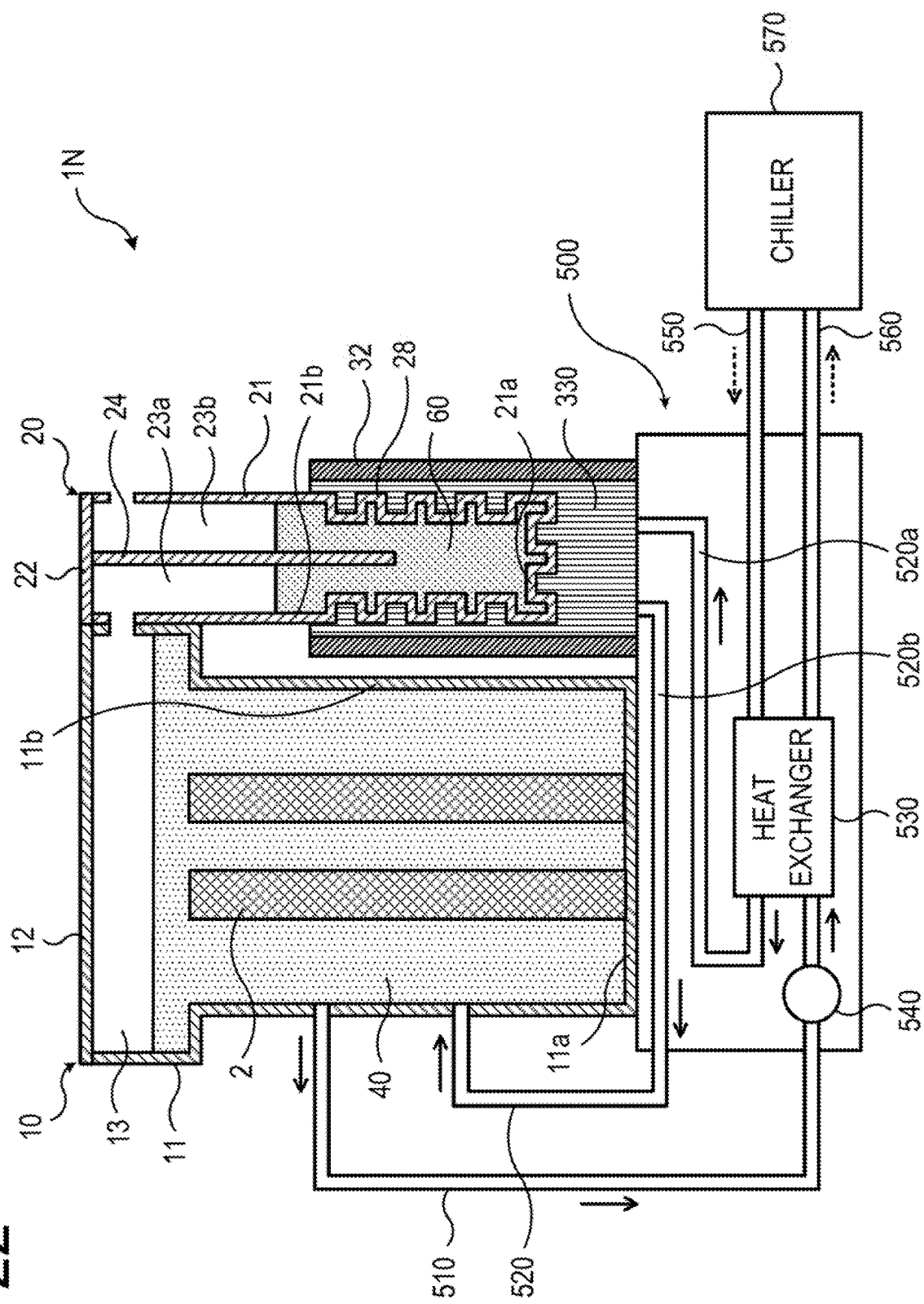
FIG. 22 is a diagram illustrating a first example of a liquid immersion cooling apparatus according to a ninth embodiment.

FIG. 22 is a diagram illustrating a first example of a liquid immersion cooling apparatus according to a ninth embodiment. FIG. 22 schematically illustrates a configuration example of the liquid immersion cooling apparatus.

The liquid immersion cooling apparatus 1N illustrated in FIG. 22 is different from the liquid immersion cooling apparatus 1L (FIG. 20) in that a cooling plate 330 which is provided to cover the bottom portion 21a and a portion of the sidewall 21b of the sealing tank main body 21 and has a flow path provided therein is used and in that the refrigerant liquid 40 flows to the flow path. The refrigerant liquid 40 which is cooled in the heat exchanger 530 of the CDU 500 and flows through the pipe 520 (a pipe 520a) is sent to the flow path inside the cooling plate 330. The refrigerant liquid 40 which has flown through the flow path inside the cooling plate 330 is sent to the liquid immersion tank 10 through the pipe 520 (a pipe 520b).

In the liquid immersion cooling apparatus 1N, the refrigerant liquid 40 cooled in the heat exchanger 530 flows through the flow path inside the cooling plate 330, so that the cooling plate 330 is cooled and the sealing tank main body 21 and the sealing material 60 are cooled. Therefore, it is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Figure 23:
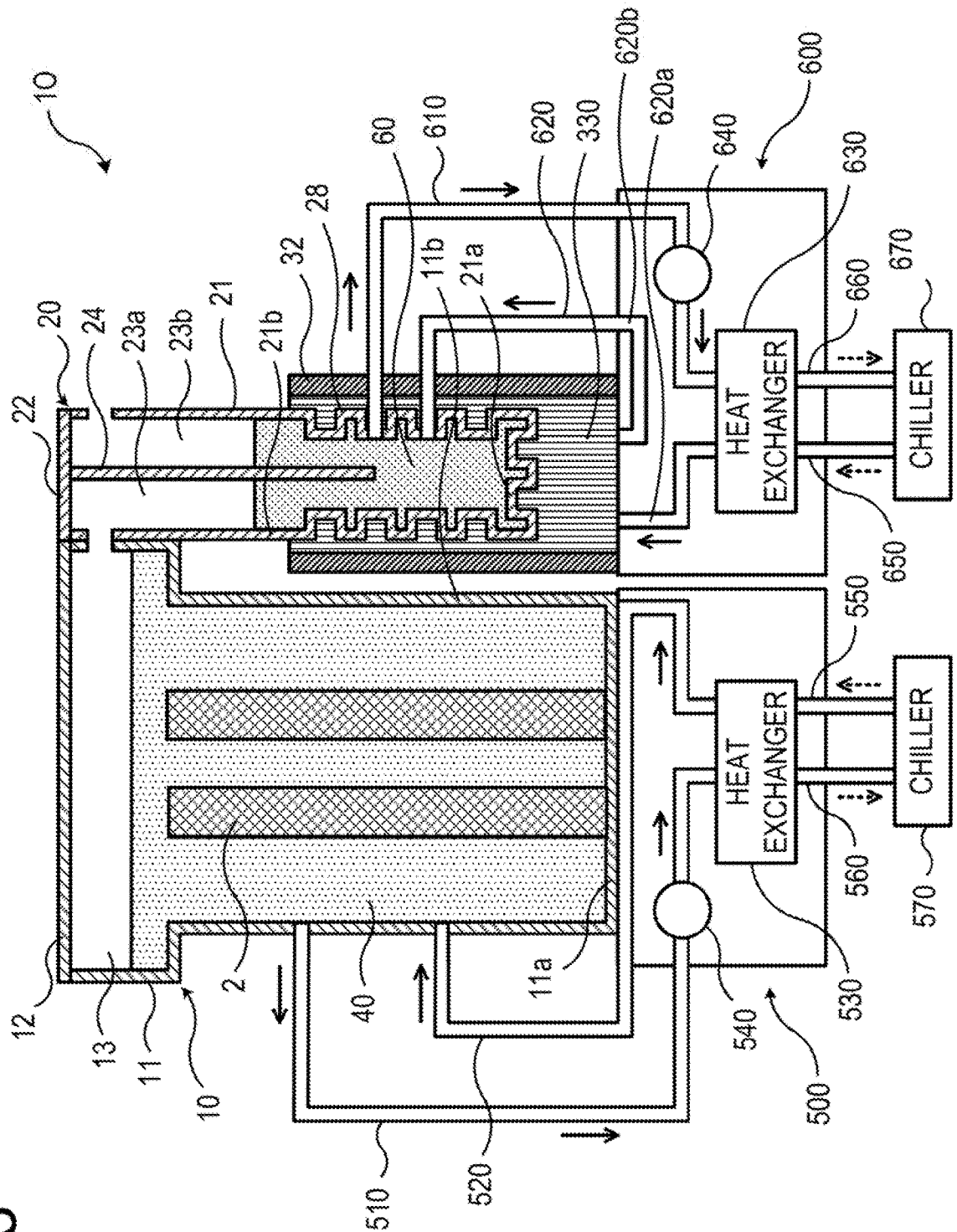
FIG. 23 is a diagram illustrating a second example of the liquid immersion cooling apparatus according to the ninth embodiment.

FIG. 23 is a diagram illustrating a second example of the liquid immersion cooling apparatus according to the ninth embodiment. FIG. 23 schematically illustrates a configuration example of the liquid immersion cooling apparatus.

The liquid immersion cooling apparatus 1O illustrated in FIG. 23 is different from the liquid immersion cooling apparatus 1M (FIG. 21) in that the cooling plate 330 which covers the bottom portion 21a and a portion of the sidewall 21b of the sealing tank main body 21 and has a flow path therein is used and in that the sealing material 60 flows to the flow path. The sealing material liquid 60 which is cooled in the heat exchanger 630 of the CDU 600 and flows through the pipe 620 (a pipe 620a) is sent to the flow path inside the cooling plate 330. The sealing material 60 which has flown through the flow path inside the cooling plate 330 is sent to the sealing tank 20 through the pipe 620 (a pipe 620b).

In the liquid immersion cooling apparatus 1O, the sealing material 60 cooled in the heat exchanger 630 flows through the flow path inside the cooling plate 330, so that the cooling plate 330 is cooled and the sealing tank main body 21 and the sealing material 60 are cooled. Therefore, it is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Here, the cooling plate 330 having the flow path therein will be described.

Figure 24A:
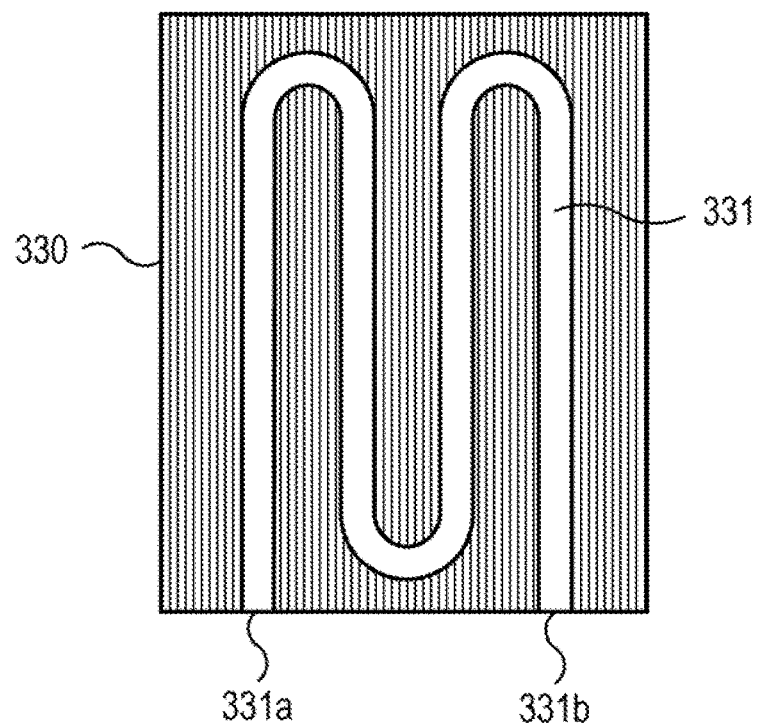
FIGS. 24A and 24B are diagrams (Part 1) illustrating a cooling plate of the liquid immersion cooling apparatus according to the ninth embodiment.
Figure 24B:
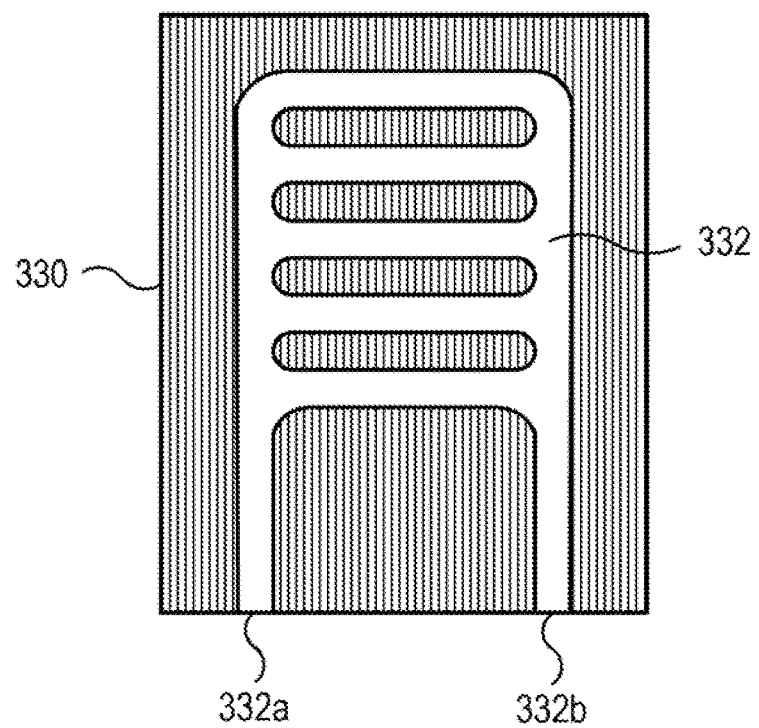
Figure 25:
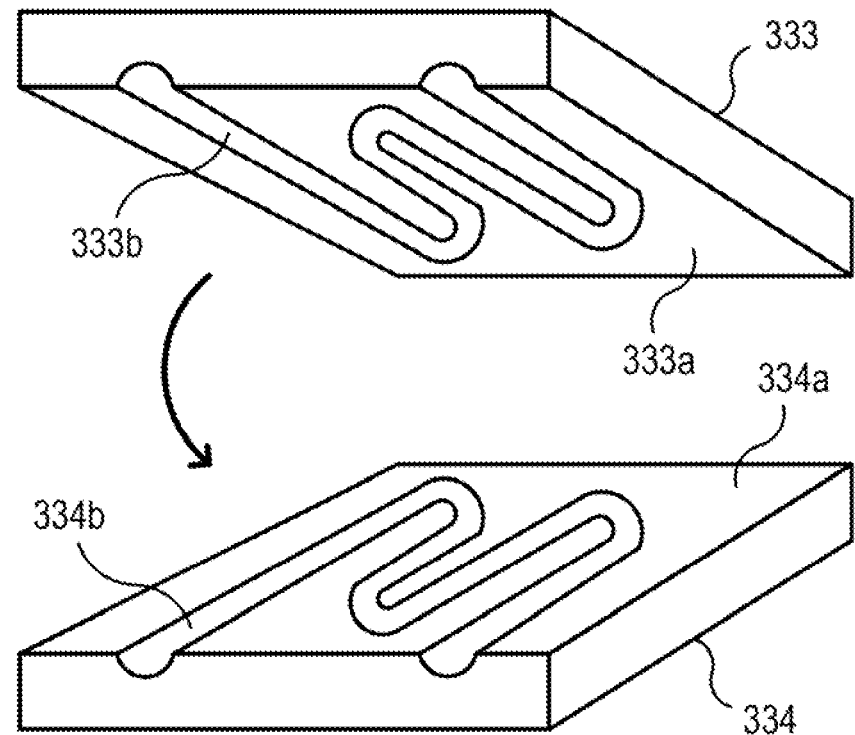
FIG. 25 is a diagram (Part 2) illustrating the cooling plate of the liquid immersion cooling apparatus according to the ninth embodiment.

FIGS. 24A, 24B, and 25 are diagrams illustrating the cooling plate of the liquid immersion cooling apparatus according to the ninth embodiment. FIGS. 24A and 24B schematically illustrate cross-sectional views of the major part of an example of the cooling plate, respectively. Further, FIG. 25 schematically illustrates an exploded perspective view of an example of the cooling plate.

For the cooling plate 330 of the liquid immersion cooling apparatus 1N and the liquid immersion cooling apparatus 1O as described above, for example, as illustrated in FIG. 24A, a cooling plate which has one flow path 331 provided therein to extend while meandering from an inlet 331a to an outlet 331b is used. In addition, for the cooling plate 330, for example, as illustrated in FIG. 24B, a cooling plate which has therein a flow path 332 having a branch path on the way from an inlet 332a to an outlet 332b is used. By providing the flow path 331 or the flow path 332 inside the cooling plate 330, the contact area of the refrigerant liquid 40 and the cooling plate 330 and the contact area of the sealing material 60 and the cooling plate 330 may increase and the cooling efficiency of the cooling plate 330 may be enhanced.

For example, as illustrated in FIG. 25, the cooling plate 330 having therein the flow path 331 illustrated in FIG. 24A is formed by bonding members 333 and 334 which are provided in surfaces 333a and 334a thereof with grooves 333b and 334b corresponding to the flow path 331 to each other. The members 333 and 334 may be bonded to each other using a method such as adhesion or welding. The cooling plate 330 having therein the flow path 332 illustrated in FIG. 24B may be formed in the same manner. Further, a portion of the pipe 620 is provided along the groove 333b in the member 333 or the groove 334b in the member 334 as illustrated in FIG. 25 and the members 333 and 334 are bonded to each other with the portion of the pipe 620 interposed therebetween, so that the cooling plate 330 may be formed.

Tenth Embodiment

Figure 26:
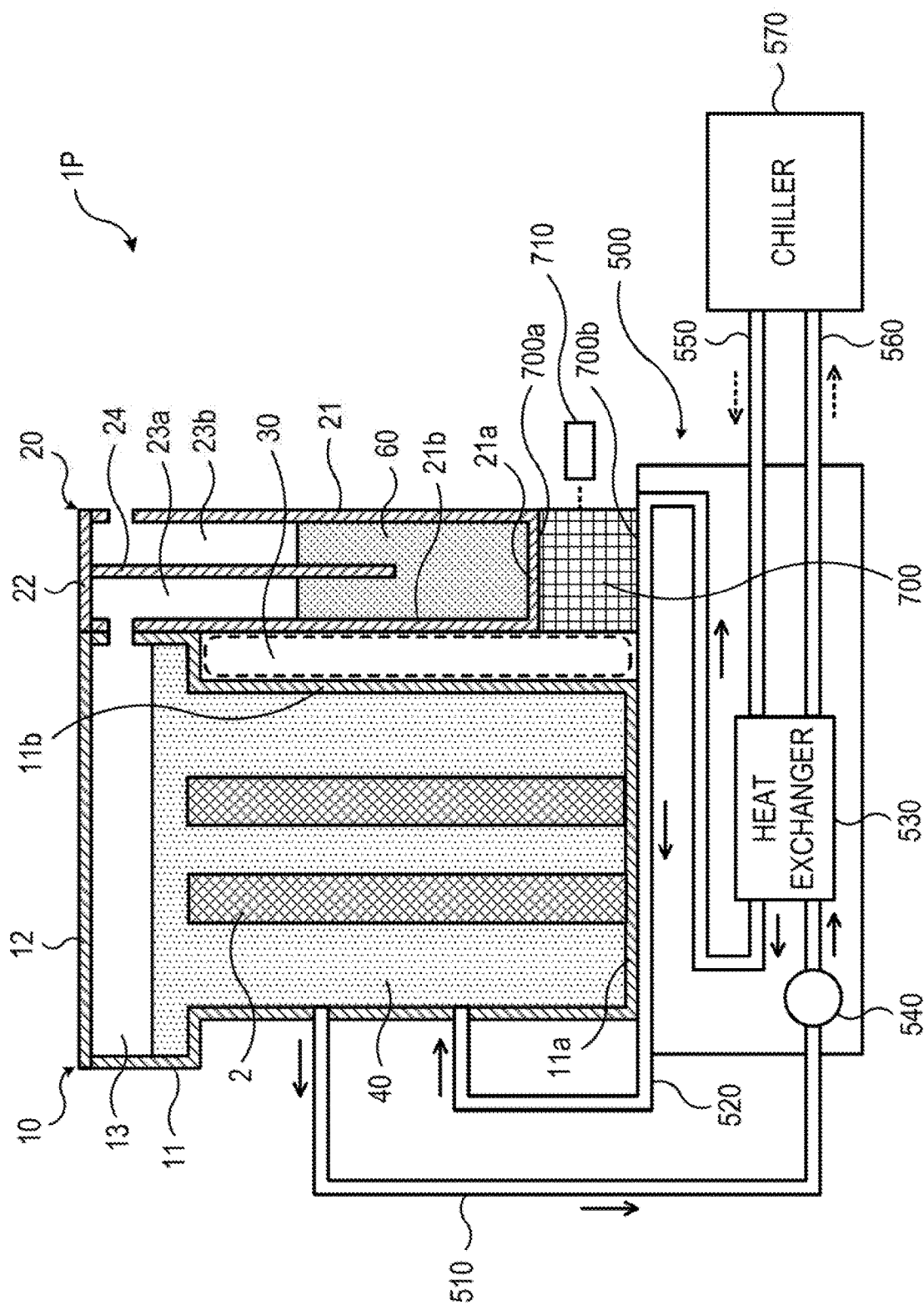
FIG. 26 is a diagram illustrating a first example of a liquid immersion cooling apparatus according to a tenth embodiment.

FIG. 26 is a diagram illustrating a first example of a liquid immersion cooling apparatus according to a tenth embodiment. FIG. 26 schematically illustrates a configuration example of the liquid immersion cooling apparatus.

The liquid immersion cooling apparatus 1P illustrated in FIG. 26 is different from the liquid immersion cooling apparatus 1F (FIG. 14) in that a Peltier device 700 is provided under the sealing tank 20 instead of a cooling plate. The Peltier device 700 receives power supplied from a power supply 710 and a surface 700a on one side thereof has a lower temperature than that of a surface 700b on the other side. In the liquid immersion cooling apparatus 1P, the Peltier device 700 is disposed such that the surface 700b having a relatively high temperature faces the pipe 520 side of the CDU 500 and the surface 700a having a relatively low temperature faces the sealing tank 20 side. The Peltier device 700 functions as a cooling unit that cools the sealing tank main body 21 and the sealing material 60 of the sealing tank 20.

In the liquid immersion cooling apparatus 1P, the ability to cool the sealing tank main body 21 and the sealing material 60 may be enhanced by providing the Peltier device 700. Therefore, it is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Figure 27:
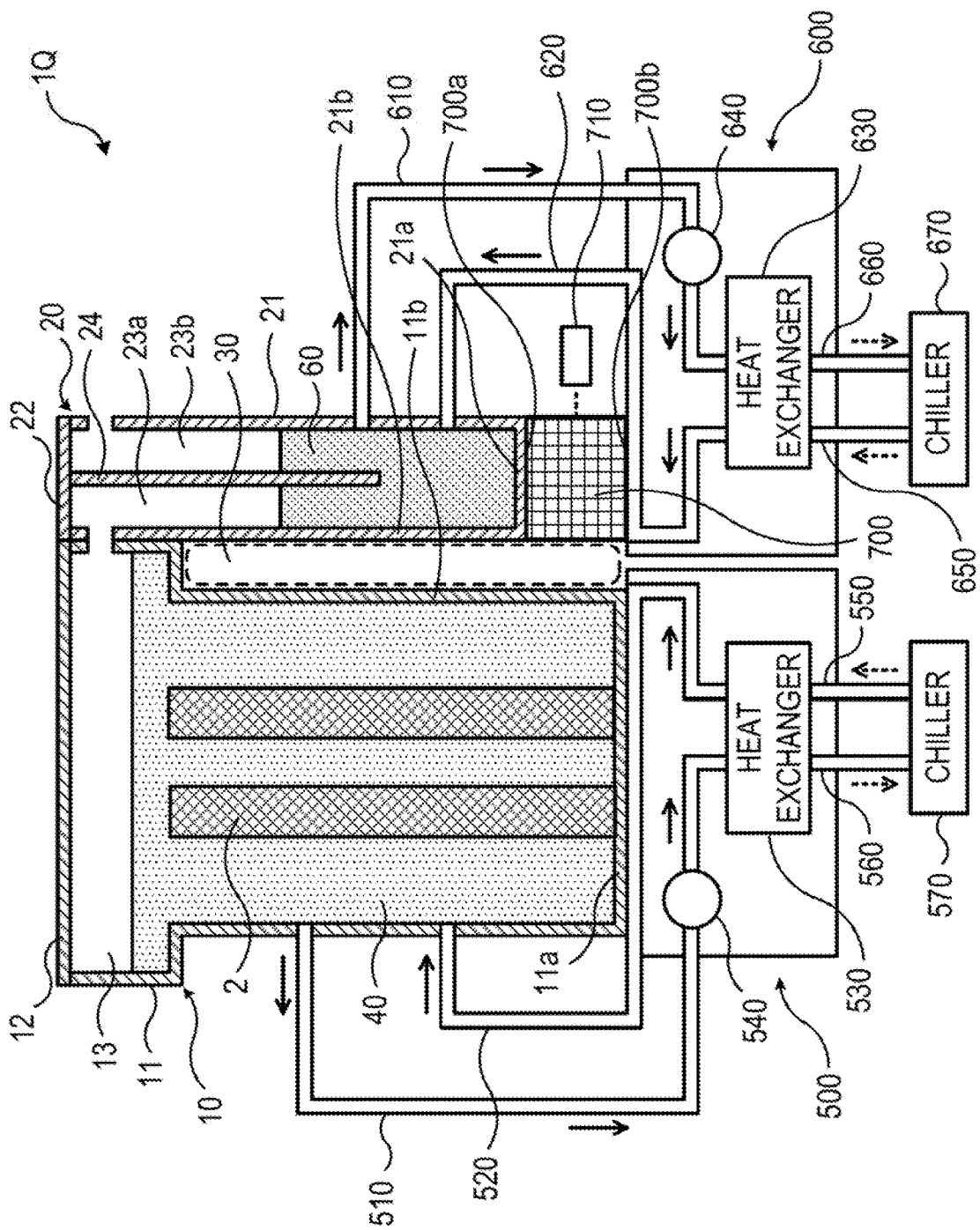
FIG. 27 is a diagram illustrating a second example of the liquid immersion cooling apparatus according to the tenth embodiment.

FIG. 27 is a diagram illustrating a second example of the liquid immersion cooling apparatus according to the tenth embodiment. FIG. 27 schematically illustrates a configuration example of the liquid immersion cooling apparatus.

The liquid immersion cooling apparatus 1Q illustrated in FIG. 27 is different from the liquid immersion cooling apparatus 1G (FIG. 15) in that the Peltier device 700 is provided under the sealing tank 20 instead of a cooling plate. In the liquid immersion cooling apparatus 1Q, the Peltier device 700 is disposed such that the surface 700b having a relatively high temperature faces the pipe 620 side of the CDU 600 and the surface 700a having a relatively low temperature faces the sealing tank 20 side. The Peltier device 700 functions as a cooling unit that cools the sealing tank main body 21 and the sealing material 60 of the sealing tank 20.

In the liquid immersion cooling apparatus 1Q, the ability to cool the sealing tank main body 21 and the sealing material 60 may be enhanced by providing the Peltier device 700. Therefore, it is possible to effectively prevent the reduction of the sealing material 60 due to evaporation and the resulting reduction of the refrigerant liquid 40, to reduce the replenishment amount or replenishment frequency of the sealing material 60 and the refrigerant liquid 40, to reduce the costs associated with the replenishment, and to sufficiently cool the electronic device 2.

Moreover, in the above description, as the liquid immersion tank 10 and the sealing tank 20, the liquid immersion tank 10 and the sealing tank 20 which have a substantially rectangular box shape in the cross-sectional view are illustrated, but the shape of the liquid immersion tank 10 and the sealing tank 20 is not limited to the shape as described above.

Figure 28A:
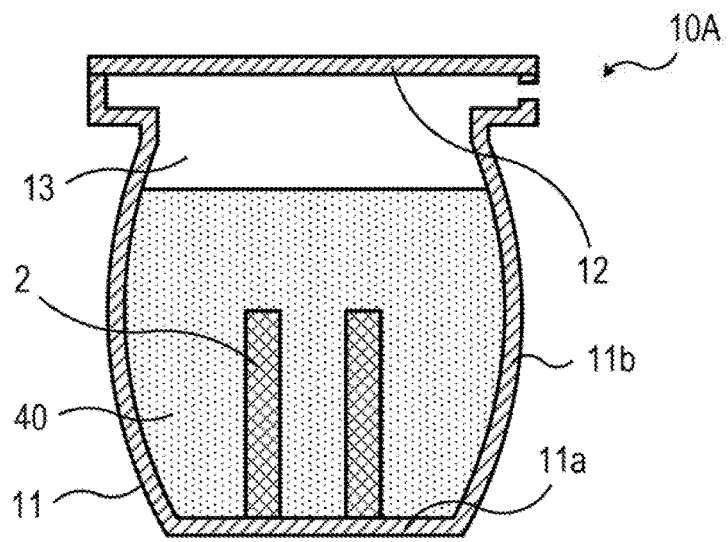
FIGS. 28A to 28C are diagrams illustrating the shape of a tank used in the liquid immersion cooling apparatus.
Figure 28B:
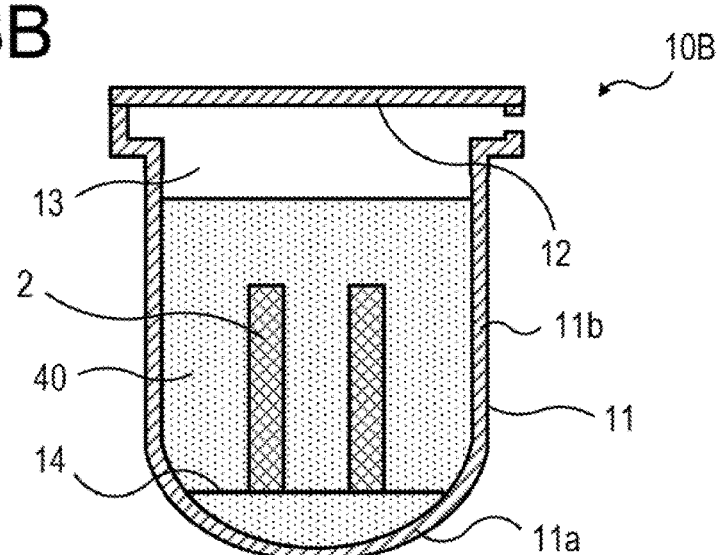
Figure 28C:
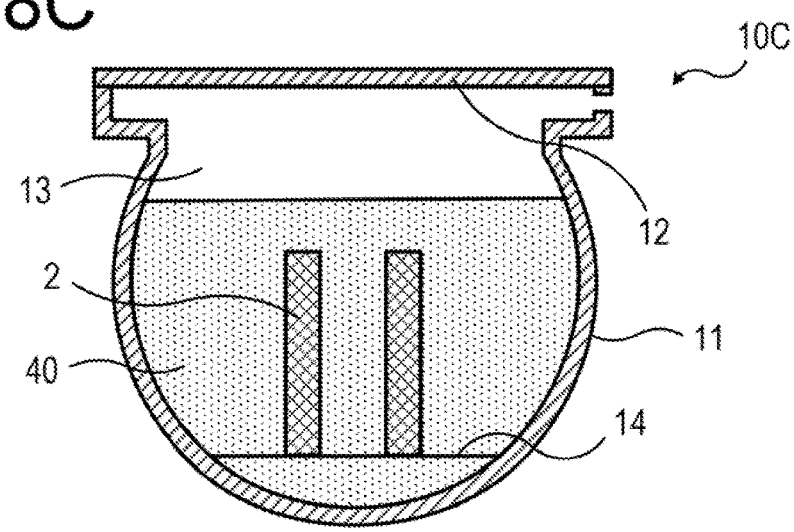

FIGS. 28A to 28C are diagrams illustrating the shape of the tank used in the liquid immersion cooling apparatus. FIGS. 28A to 28C schematically illustrate cross-sectional views of the major part of the tank, respectively.

For example, as the liquid immersion tank 10 which accommodates therein the refrigerant liquid 40 in which the electronic device 2 is immersed, as illustrated in FIG. 28A, a liquid immersion tank 10A in which the sidewall 11b rising upward from the bottom portion 11a has a curved shape that bulges outward may be used. Alternatively, as the liquid immersion tank 10 which accommodates therein the refrigerant liquid 40 in which the electronic device 2 is immersed, as illustrated in FIG. 28B, a liquid immersion tank 10B in which the bottom portion 11a has a curved shape that bulges outward may be used. Yet alternatively, as the liquid immersion tank 10 which accommodates therein the refrigerant liquid 40 in which the electronic device 2 is immersed, as illustrated in FIG. 28C, a liquid immersion tank 10C in which both the bottom portion 11a and the sidewall 11b are spherically curved outward may be used. Moreover, in a case of the shapes of the liquid immersion tank 10B and the liquid immersion tank 10C, a pedestal 14 may be provided to mount the electronic device 2 inside the liquid immersion tank.

The sealing tank 20 in which the sealing material 60 is accommodated is provided adjacent to the liquid immersion tank 10A, the liquid immersion tank 10B, or the liquid immersion tank 10C such that the heat insulating portion 30 is interposed therebetween and the gas phase portion 23a communicates with the gas phase portion 13. Further, as the sealing tank 20, according to the examples of FIGS. 28A to 28C, sealing tanks having various shapes such as a sealing tank in which the sidewall 21b or the bottom portion 21a is curved or a sealing tank having a spherical shape may be used.

Further, the liquid immersion tank 10 described in the above description may be provided with a pressure regulating valve connected to the gas phase portion 13 in order to prevent an excessive increase in the internal pressure of the gas phase portion 13 due to evaporation of the refrigerant liquid 40. Alternatively, a pressure regulating valve may be provided to be connected to the gas phase portion 23a of the sealing tank 20 which communicates with the gas phase portion 13 of the liquid immersion tank 10.

Further, the liquid immersion tank 10 and the sealing tank 20 may be connected to each other by a pipe which interconnects the vent holes 50 and 51 of both the tanks as long as the pipe may communicate the gas phase portion 13 and the gas phase portion 23a with each other and may pass the cable 2a connected to the electronic device 2 immersed in the liquid immersion tank 10 therethrough. When the liquid immersion tank 10 and the sealing tank 20 are connected to each other via the pipe, the vent hole 50 is not limited to the liquid immersion tank main body 11, but may be provided in the lid body 12 of the liquid immersion tank 10, and the vent hole 51 is not limited to the sealing tank main body 21, but may be provided in the lid body 22 of the sealing tank 20.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid immersion cooling apparatus comprising:
a first receptacle in which a refrigerant liquid is accommodated, configured to include:
a first tank that has a first sidewall,
a first lid configured to cover the first tank, and
a first space provided between the refrigerant liquid and the first lid;
a second receptacle in which a sealing material is accommodated, configured to include:
a second tank that has a second sidewall facing the first sidewall and a third sidewall facing the second sidewall,
a second lid configured to cover the second tank,
a second space provided between the sealing material and the second lid, and configured to communicate with the first space through a first hole formed through both the first sidewall and the second sidewall, and
a third space provided between the sealing material and the second lid, partitioned from the second space, and configured to communicate with an outside of the second receptacle; and
a heat insulator provided outside of the second space and the third space and between the first sidewall and the second sidewall.

2. The liquid immersion cooling apparatus according to claim 1, wherein the heat insulator is a hollow provided between the first sidewall and the second sidewall.

3. The liquid immersion cooling apparatus according to claim 1, wherein the heat insulator is a heat insulating material provided between the first sidewall and the second sidewall.

4. The liquid immersion cooling apparatus according to claim 1, further comprising:
a cooling plate connected to the second tank, and configured to cool the second tank and the sealing material.

5. The liquid immersion cooling apparatus according to claim 4, further comprising:
a first cooler connected to a first flow path and a second flow path which are connected to the second tank, and configured to cool the sealing material sent from the second tank through the first flow path and to send the cooled sealing material to the second tank through the second flow path.

6. The liquid immersion cooling apparatus according to claim 5, wherein the second flow path is connected to the cooling plate.

7. The liquid immersion cooling apparatus according to claim 5, further comprising:
a second cooler connected to a third flow path and a fourth flow path which are connected to the first tank, and configured to cool the refrigerant liquid sent from the first tank through the third flow path and to send the cooled refrigerant liquid to the first tank through the fourth flow path.

8. The liquid immersion cooling apparatus according to claim 7, wherein the fourth flow path is connected to the cooling plate.

9. The liquid immersion cooling apparatus according to claim 1, wherein a surface of the second tank is configured to have an uneven portion.

10. The liquid immersion cooling apparatus according to claim 1, wherein the second receptacle is configured to include a partition provided on the second lid to partition a portion between the sealing material and the second lid body into the second space and the third space.

11. The liquid immersion cooling apparatus according to claim 1, wherein a cable coupled to an electronic device immersed in the refrigerant liquid is drawn out to the outside through the first space, the second space, the sealing material, and the third space.

12. The liquid immersion cooling apparatus according to claim 1, wherein a second hole is formed through the third sidewall, and the third space is configured to communicate with the outside of the second receptacle through the second hole.

13. The liquid immersion cooling apparatus according to claim 1, wherein the heat insulator is provided below the first hole.

* * * * *